United States Patent
Unno

(10) Patent No.: US 11,431,039 B2
(45) Date of Patent: Aug. 30, 2022

(54) METHOD OF CHARGING AND DISCHARGING SECONDARY BATTERY, METHOD OF DETECTING DETERIORATION IN SECONDARY BATTERY, METHOD OF DETECTING CHARGING ABNORMALITY OF SECONDARY BATTERY, AND CHARGE AND DISCHARGE CONTROL DEVICE

(71) Applicant: MURATA MANUFACTURING CO., LTD., Kyoto (JP)

(72) Inventor: Ryota Unno, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 381 days.

(21) Appl. No.: 16/523,490

(22) Filed: Jul. 26, 2019

(65) Prior Publication Data

US 2019/0348721 A1    Nov. 14, 2019

Related U.S. Application Data

(63) Continuation of application No. PCT/JP2017/035013, filed on Sep. 27, 2017.

(30) Foreign Application Priority Data

Jan. 27, 2017  (JP) .............................. JP2017-013135

(51) Int. Cl.
*H01M 10/48*     (2006.01)
*G01R 31/387*    (2019.01)
(Continued)

(52) U.S. Cl.
CPC ........ *H01M 10/484* (2013.01); *G01R 31/387* (2019.01); *H01M 10/0525* (2013.01);
(Continued)

(58) Field of Classification Search
CPC .......... H01M 10/484; H01M 10/0525; H01M 10/4235; H01M 10/052; H01M 10/482;
(Continued)

(56) References Cited

U.S. PATENT DOCUMENTS 5,760,570 A * 6/1998 Nagai ................... H02J 7/0026
                                                    320/DIG. 31
6,696,815 B1 * 2/2004 Kikuchi ................ H02J 7/1461
                                                    320/148
(Continued)

FOREIGN PATENT DOCUMENTS

CN     105659428 A * 6/2016 ........ H01M 10/4257
CN     106249154 A * 12/2016 ............... B60K 1/04
(Continued)

OTHER PUBLICATIONS

Japanese Office Action dated Apr. 21, 2020 in corresponding Japanese Application No. 2018-564107.
(Continued)

*Primary Examiner* — M Baye Diao
(74) *Attorney, Agent, or Firm* — K&L Gates LLP

(57) ABSTRACT

A method of charging and discharging a secondary battery includes detecting a displacement in a secondary battery by one or more sensors and controlling a charging and discharging current based on the detection result of each of the sensors. The charging and discharging current of the secondary battery is controlled so that an amount of displacement of the secondary battery does not exceed a threshold value.

5 Claims, 20 Drawing Sheets

(51) Int. Cl.
  *H01M 10/0525* (2010.01)
  *H01M 10/42* (2006.01)
  *H02J 7/00* (2006.01)

(52) U.S. Cl.
  CPC ....... *H01M 10/4235* (2013.01); *H02J 7/0021* (2013.01); *H02J 7/0029* (2013.01); *H02J 7/00302* (2020.01)

(58) Field of Classification Search
  CPC .............. H01M 10/441; H01M 10/425; G01R 31/387; H02J 7/0021; H02J 7/0029; H02J 7/00302; H02J 2310/48; H02J 7/0014; H02J 7/0018; Y02E 60/10; Y02T 10/70
  USPC .......................................................... 320/134
  See application file for complete search history.

(56) References Cited

U.S. PATENT DOCUMENTS

| | | | | |
|---|---|---|---|---|
| 7,675,267 B2 * | 3/2010 | Ozawa | ................. | H02J 7/0068 307/66 |
| 10,386,418 B2 * | 8/2019 | Takegami | ............. | H01M 10/44 |
| 10,581,044 B2 * | 3/2020 | Lee | .................... | H01M 50/583 |
| 2015/0160302 A1 * | 6/2015 | Xu | ........................ | H01M 10/42 324/427 |
| 2015/0236529 A1 * | 8/2015 | Tanaka | ................ | B60L 15/2009 320/109 |
| 2015/0295431 A1 | 10/2015 | Honda et al. | | |
| 2016/0064780 A1 * | 3/2016 | Jarvis | ................ | H01M 10/4257 429/61 |
| 2017/0077561 A1 | 3/2017 | Fukuda et al. | | |
| 2018/0017628 A1 * | 1/2018 | Takegami | ............ | G01R 31/392 |
| 2019/0178944 A1 * | 6/2019 | Rango | .................. | G01R 31/392 |

FOREIGN PATENT DOCUMENTS

| | | | | |
|---|---|---|---|---|
| EP | 3300139 B1 * | 11/2019 | ........ | H01M 10/0585 |
| JP | S5027181 B1 | 9/1975 | | |
| JP | S63268445 A | 11/1988 | | |
| JP | H04281340 A | 10/1992 | | |
| JP | 2006024445 A | 1/2006 | | |
| JP | 4157317 B2 * | 10/2008 | ............. | B60L 50/16 |
| JP | 2011047918 A * | 3/2011 | ......... | G01R 31/3624 |
| JP | 2012145403 A * | 8/2012 | ......... | G01R 31/3828 |
| JP | 2013065515 A | 4/2013 | | |
| JP | 2015208218 A | 11/2015 | | |
| JP | 2016027539 A | 2/2016 | | |
| JP | 2016126943 A * | 7/2016 | ............. | Y02E 60/10 |
| JP | 2016126943 A | 7/2016 | | |

OTHER PUBLICATIONS

International Search Report for Application No. PCT/JP2017/035013, dated Oct. 24, 2017.

* cited by examiner

METHOD OF CHARGING AND DISCHARGING SECONDARY BATTERY, METHOD OF DETECTING DETERIORATION IN SECONDARY BATTERY, METHOD OF DETECTING CHARGING ABNORMALITY OF SECONDARY BATTERY, AND CHARGE AND DISCHARGE CONTROL DEVICE

CROSS REFERENCE TO RELATED APPLICATIONS

The present application is a continuation of PCT patent application no. PCT/JP2017/035013, filed on Sep. 27, 2017, which claims priority to Japanese patent application no. JP2017-013135 filed on Jan. 27, 2017, the entire contents of which are being incorporated herein by reference.

BACKGROUND

The present disclosure generally relates to a method of charging and discharging a secondary battery, a method of detecting deterioration in a secondary battery, a method of detecting charging abnormality of a secondary battery, and a charge and discharge control device.

In a lithium ion secondary battery, an electrode structure, in which a cathode member, a separator, and an anode member are wound or laminated is housed, for example, in an exterior member made of a laminated film and is filled with an electrolyte. However, the lithium ion secondary battery has a problem in that an active material expands and contracts due to an insert and extract reaction of lithium (or alloying reaction) during the charging and discharging, and therefore a stress applied to component members of the lithium ion secondary battery increases and the lithium ion secondary battery itself is displaced (deformed).

SUMMARY

The present disclosure generally relates to a method of charging and discharging a secondary battery, a method of detecting deterioration in a secondary battery, a method of detecting charging abnormality of a secondary battery, and a charge and discharge control device.

An object of the present disclosure is to provide a method of charging and discharging a secondary battery that performs a charge and discharge control of the secondary battery based on a displacement of the secondary battery, a method of detecting deterioration in a secondary battery based on the displacement of the secondary battery, a method of detecting charging abnormality of a secondary battery based on the displacement of the secondary battery, and a charge and discharge control device performing a charge and discharge control of a secondary battery based on the displacement of the secondary battery.

According to an embodiment of the present technology, a method of charging and discharging a secondary battery is provided. The method includes detecting a displacement in the secondary battery by one or more sensors; and controlling a charging and discharging current based on a detection result of each of the sensors, wherein the charging and discharging current of the secondary battery is controlled so that an amount of displacement of the secondary battery does not exceed a threshold value.

According to an embodiment of the present technology, a charge and discharge control device is provided. The charge and discharge control device includes:

a secondary battery including one or more sensors configured to detect an amount of displacement in the secondary battery; and a controller configured to control a charging and discharging current of the secondary battery based on a detection result of each of the sensors, wherein the controller is configured to control the charging and discharging current of the secondary battery so that the amount of displacement of the secondary battery does not exceed a threshold value.

According to an embodiment of the present technology, a charge and discharge control device is provided. The charge and discharge control device includes:

a secondary battery pack including a plurality of secondary batteries including one or more sensors configured to detect an amount of displacement in each of the secondary batteries; and a controller configured to control a charging and discharging current of the secondary battery pack based on a detection result of each of the sensors, wherein the controller is configured to control a charging and discharging current of each of the secondary batteries or the charging and discharging current of the secondary battery pack so that the amount of displacement of each of the secondary batteries does not exceed a threshold value.

According to an embodiment of the present technology, a charge and discharge control device is provided. The charge and discharge control device includes:

a secondary battery pack including a plurality of secondary batteries and one or more of sensors configured to detect an amount of displacement in the secondary battery pack; and a controller configured to control a charging and discharging current of the secondary battery pack based on a detection result of each of the sensors, wherein the controller is configured to control the charging and discharging current of the secondary battery pack so that the amount of displacement of the secondary battery pack does not exceed a threshold value.

According to an embodiment of the present technology, a method of detecting deterioration in a secondary battery including one or more sensors is provided. The method includes:

detecting, by each of the sensors, a displacement in the secondary battery; and notifying that the secondary battery deteriorates in a case that an amount of displacement of the secondary battery detected by each of the sensors exceeds a value.

According to an embodiment of the present technology, a method of detecting charging abnormality of a secondary battery including one or more sensors is provided. The method includes:

detecting, by each of the sensors, a displacement in the secondary battery; and notifying that charging and discharging abnormality occurs in the secondary battery in a case that an amount of displacement of the secondary battery detected by each of the sensors exceeds a value.

In the method of charging and discharging a secondary battery according to the present disclosure, the displacement occurring in the secondary battery due to the charging and discharging is detected by one or a plurality of sensors to control the charging and discharging current so that the amount of displacement of the secondary battery does not exceed the predetermined threshold value.

Accordingly, it is possible to reliably prevent the abnormal displacement occurring in the secondary battery and reliably suppress the secondary battery from deteriorating. In the charge and discharge control device according to an embodiment of the present technology, the controller controls the charging and discharging current of the secondary battery so that the amount of displacement of the secondary battery does not exceed the predetermined threshold value. In the charge and discharge control device according to an embodiment of the present technology, the controller controls the charging and discharging current of each of the secondary batteries or the charging and discharging current of the secondary battery pack so that the amount of displacement of each of the secondary batteries does not exceed the predetermined threshold value. In the charge and discharge control device according to an embodiment of the present technology, the controller controls the charging and discharging current of the secondary battery pack so that the amount of displacement of the secondary battery pack does not exceed the predetermined threshold value.

Accordingly, it is possible to reliably prevent the abnormal displacement from occurring in the secondary battery and reliably suppress the secondary battery from deteriorating. In the method of detecting deterioration in a secondary battery according to an embodiment of the present disclosure, when the amount of displacement of the secondary battery detected by each of the sensors exceeds the prescribed value, it is notified that the secondary battery deteriorates. Accordingly, it is possible to reliably suppress the use of the deteriorating secondary battery. In the method of detecting charging abnormality of a secondary battery according to an embodiment of the present disclosure, when the amount of displacement of the secondary battery detected by each of the sensors exceeds the prescribed value, it is notified that the charging and discharging abnormality occurs in the secondary battery. Accordingly, it is possible to reliably prevent the secondary battery with the charging and discharging abnormality from being used as it is. It should be understood that the effects described herein are merely illustrative and other suitable properties relating to the present technology may be realized and as further described.

DETAILED DESCRIPTION

Figure 1A:
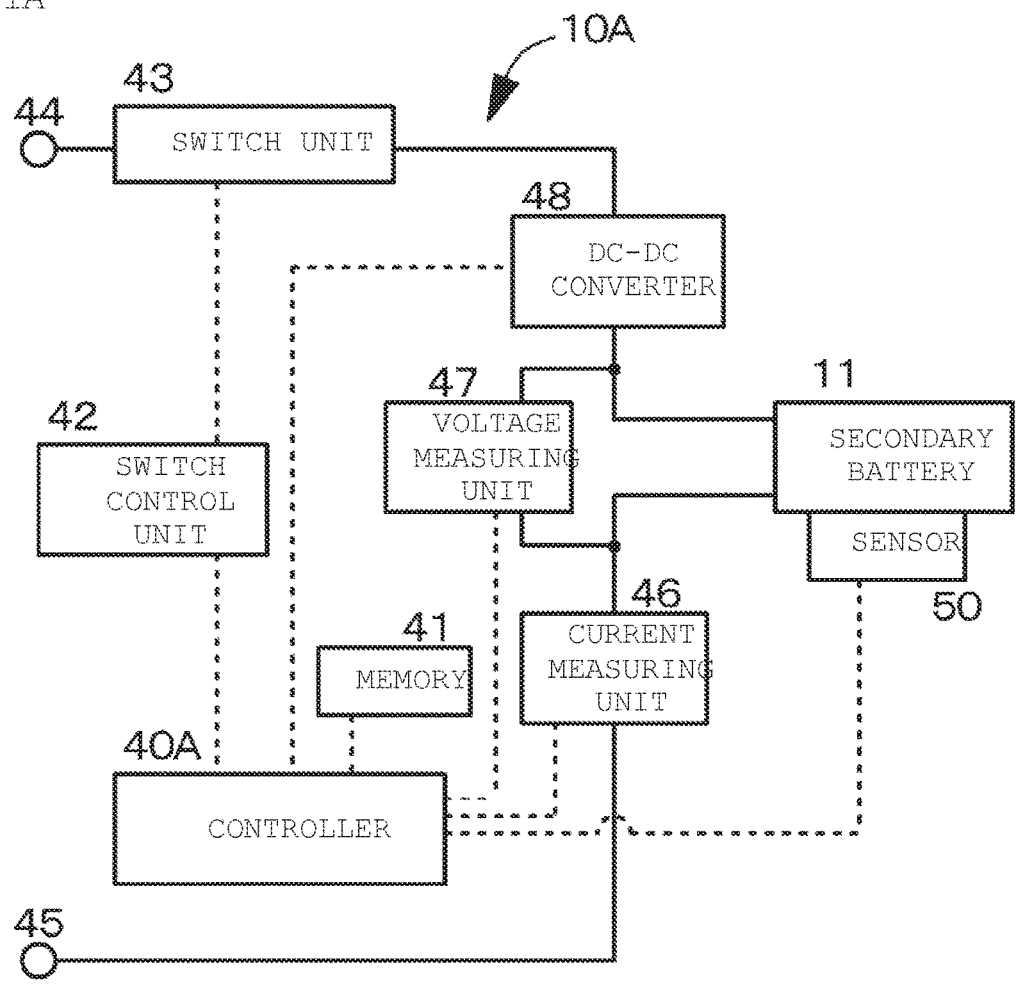
FIGS. 1A and 1B each are a conceptual view of a charge and discharge control device, and a plan view of a secondary battery according to an embodiment of the present disclosure.

As described herein, the present disclosure will be described based on examples with reference to the drawings, but the present disclosure is not to be considered limited to the examples, and various numerical values and materials in the examples are considered by way of example.

In a method of charging and discharging a secondary battery according to the present disclosure, it is preferable to reduce a charging and discharging current of the secondary battery so that an amount of displacement of the secondary battery does not exceed a predetermined threshold value. In this case, when the secondary battery is charged, in the secondary battery, it is preferable to reduce the charging current of the secondary battery so that a value of $\Delta S=|S(SOC)-S_{Ini}(SOC)|/S_{max}$ does not exceed a predetermined threshold value. Such a form can be applied to a control of a charging and discharging current in the charge and discharge control device according to the first to third aspects of the present disclosure. Here, $S_{Ini}$(SOC): Amount of displacement obtained using a state of charge (SOC) value as a parameter when the secondary battery is charged to a current value that is k times a reference current value (however, 0<k<1), S(SOC): Amount of displacement obtained using the SOC value as the parameter when the secondary battery is actually charged, and $S_{max}$: Maximum value of the amount of displacement at the time of a full charge in a previous time.

The reference current value can be calculated based on a rated capacity of a battery, and as a value of k, a value (curve) that minimizes the $S_{Ini}$ is preferably used. In addition, the SOC value and the $S_{Ini}$ can be determined by normalizing the state of charge of the secondary battery with a full charge capacity (mAh) of the previous charging. That is, for the first charging, {current charge capacity (mAh)}/{rated capacity (mAh)}× 100(%) can be obtained, and for the second and subsequent charging, {current charge capacity (mAh)/{full charge capacity (mAh)}×100(%) can be obtained.

In the method of charging and discharging a secondary battery according to the present disclosure including various preferred forms described above, a predetermined threshold value can be defined depending on a range of an SOC value when the secondary battery is charged. Such a form can be applied to a control of a charging and discharging current in the charge and discharge control device according to the first to third aspects according to the present disclosure.

Furthermore, in the method of charging and discharging a secondary battery according to the present disclosure including various preferred forms described above, a displacement occurring in the secondary battery can be a distortion of the secondary battery or a change in thickness of the secondary battery. In addition, in the charge and discharge control device according to the first aspect of the present disclosure, the displacement occurring in the secondary battery can be the distortion of the secondary battery or the change in thickness of the secondary battery.

In the charge and discharge control device according to the first aspect of the present disclosure including the above preferred form, or alternatively, in the charge and discharge control device according to the second aspect and the third aspect of the present disclosure, the secondary battery can be configured to include a cathode member, an anode member, a separator, and a gel-like electrolyte, or alternatively, the secondary battery may be configured to include a cathode member, an anode member, and a solid electrolyte layer.

In the method of charging and discharging a secondary battery according to the present disclosure, the charging of the secondary battery may be completed if the charging voltage reaches a predetermined value when the secondary battery is charged. In some cases, after the charging voltage reaches a predetermined value, constant voltage charging (CV charging) can be performed to complete the charging.

The number of sensors is not limited to one, and may be plural (two or more). In the latter case, the charging and discharging current may be controlled so that among amounts of displacement detected by a plurality of sensors, a maximum amount of displacement does not exceed a predetermined threshold value. Alternatively, the charging and discharging current may be controlled so that an average value of the amounts of displacement does not exceed a predetermined threshold value, or the charging and discharging current may be controlled so that the maximum amount of displacement does not exceed a first predetermined threshold value and the average value of the amounts of displacement does not exceed a second predetermined threshold value (<first predetermined threshold value).

Examples of the sensor which is used in the method of charging and discharging a secondary battery, the method of detecting deterioration in a secondary battery, and the method of detecting charging abnormality of a secondary battery according to the present disclosure, and the charge and discharge control device according to the first to third aspects of the present disclosure include an optical sensor (LED displacement sensor or laser displacement sensor), an ultrasonic displacement sensor, an eddy current displacement sensor, a linear encoder type contactless sensor, a differential transformer type contact sensor, a pressure-sensitive conductivity conversion type pressure sensor, a capacitance type pressure sensor, a piezoelectric type pressure sensor, a strain detection type pressure sensor, a semiconductor strain gauge, and the like. Here, when the displacement occurring in the secondary battery is the distortion of the secondary battery, sensors such as the pressure-sensitive conductivity conversion type pressure sensor, the capacitance type pressure sensor, the piezoelectric type pressure sensor, the strain detection type pressure sensor, and the semiconductor strain gauge may be used, and when the displacement occurring in the secondary battery is the change in thickness of the secondary battery, sensors such as the optical sensor (LED displacement sensor or laser displacement sensor), the ultrasonic displacement sensor, the eddy current type displacement sensor, the linear encoder type contactless sensor, or the differential transformer contact sensor may be used.

In the method of detecting deterioration in a secondary battery according to the present disclosure, when the amount of displacement of the secondary battery detected by each of the sensors exceeds a prescribed value, it is notified that the secondary battery deteriorates, or alternatively, in the method of detecting charging abnormality of a secondary battery according to the present disclosure, when the amount of displacement of the secondary battery detected by each of the sensors exceeds a prescribed value, it is notified that the charging abnormality occurs in the secondary battery, which may be notified by, for example, voice or a warning sound or notified by an image display or notified by a combination thereof.

As the secondary battery in the method of charging and discharging a secondary battery, the secondary battery in the method of detecting deterioration in a secondary battery, and the secondary battery in the method of detecting charging abnormality of a secondary battery according to the present disclosure, and the secondary battery in the charge and discharge control device according to the first to third aspects of the present disclosure (hereinafter, these secondary battery are collectively referred to as "secondary battery and the like in the present disclosure"), the lithium ion secondary battery can be exemplified, but the secondary battery of the present disclosure is not limited thereto, and examples of the secondary battery include a magnesium ion battery, a metal air secondary battery (examples of the metal and the alloy material that can be used for the anode active material include tin and silicon; alkali metals such as lithium, sodium, and potassium; Group 2 elements such as magnesium and calcium; Group 13 elements such as aluminum; transition metals such as zinc and iron; or alloy materials or compounds containing these metals) having an anode member containing an anode active material containing metal and an alloy material, a lithium-sulfur secondary battery, a sodium-sulfur secondary battery, a sodium ion secondary battery, and the like. A configuration and a structure of the secondary battery itself can be the well-known configuration and structure.

In the secondary battery and the like according to the present disclosure, the electrode structure including the cathode member, the separator, and the anode member may be in a state in which the cathode member, the separator, the anode member, and the separator are wound or may be in a state where the cathode member, the separator, the anode member, and the separator are stacked. Alternatively, the electrode structure including the cathode member, the solid electrolyte layer, and the anode member may be in the wound state or in the stacked state.

In the charge and discharge control devices according to the second and third aspects of the present disclosure, a plurality of secondary batteries may be connected in series or may be connected in parallel, or a plurality of sets of secondary batteries connected in series (sometimes called "series and secondary battery unit" for convenience) may be secondary battery packs (assembled battery) connected in parallel or a plurality of sets of secondary batteries connected in parallel (sometimes called "parallel and secondary battery unit" for convenience) may be secondary battery packs (assembled battery) connected in series. In the charge and discharge control device according to the second aspect of the present disclosure, all the secondary batteries which constitute the secondary battery pack (assembled battery) may include a sensor, or some of the secondary batteries which constitute the secondary battery pack (assembled battery) may include a sensor. In addition, in the charge and discharge control device according to the second aspect of the present disclosure, since there can usually be variations in the amounts of displacement of the plurality of secondary batteries, the charging and discharging current may be controlled so that the amount of displacement of the secondary battery having the maximum amount of displacement among the plurality of secondary batteries does not exceed a predetermined threshold value. Alternatively, the charging and discharging current may be controlled so that an average value of the amounts of displacement of the plurality of secondary batteries does not exceed a predetermined threshold value, or the charging and discharging current may be controlled so that the maximum amount of displacement does not exceed a first predetermined threshold value and the average value of the amounts of displacement does not exceed a second predetermined threshold value (<first predetermined threshold value).

In the charge and discharge control device according to the first and second aspects of the present disclosure, the amount of displacement occurring in the secondary battery due to the charging and discharging is detected by the sensor, but the sensor may be fixed (for example, bonded) to an outer surface of the secondary battery, disposed inside the secondary battery, or disposed outside the secondary battery. In the charge and discharge control device according to the third aspect of the present disclosure, the amount of displacement occurring in the secondary battery pack due to the charging and discharging is detected by the sensor, but the secondary battery pack including a plurality of secondary batteries is held by, for example, a secondary battery pack holding member. As a result of transmitting the displacement occurring in the secondary battery pack due to the charging and discharging to the secondary battery pack holding member, a distortion, a stress, or a pressure occurs in the secondary battery pack holding member, but the distortion, stress, or pressure may be detected by the sensor.

Examples of the charging current for the charging of the secondary battery can include a pulsed charging current or a continuous charging current. In the former case, it is possible to perform the control of the charging current for the charging of the secondary battery by controlling a so-called duty ratio. In the latter case, it is possible to perform the control of the charging current for the charging of the secondary battery by controlling a value of the charging current itself. The charge and discharge control device itself can be a charge and discharge control device having the well-known configuration and structure. A displacement amount acquisition circuit which acquires the amount of displacement obtained by the sensor can be a well-known circuit configuration which include an MPU, a CPU, various storage media (for example, memory), a sensor drive circuit or the like. For example, the displacement amount acquisition circuit is included in the charge and discharge control device.

A strip-like electrode structure or a wound electrode laminate can be housed in an electrode structure housing member in a wound state, and the strip-like electrode structure can be housed in an electrode structure housing member in a stacked state. In these cases, an external shape of the electrode structure housing member can have a cylindrical or rectangular (flat) shape. Examples of the shape and form of the secondary battery include a coin type, a button type, a disk type, a flat type, a square type, a cylindrical type, and a laminate type (laminated film type).

Examples of the material of the electrode structure housing member (battery can) constituting a cylindrical or rectangular secondary battery include iron (Fe), nickel (Ni), aluminum (Al), titanium (Ti) or the like, alloys thereof, stainless steel (SUS) and the like. The battery can is preferably plated with, for example, nickel or the like in order to prevent electrochemical corrosion accompanied by the charging and discharging of the secondary battery. An exterior member in the laminate type (laminated film type) secondary battery preferably has a form having a laminated structure of a plastic material layer (fusion layer), a metal layer, and a plastic material layer (surface protective layer), that is, a form which is the laminated film. In the case of the laminated film type secondary battery, for example, after the exterior member is folded so that the fusion layers face each other with the electrode structure interposed therebetween, outer peripheral edge portions of the fusion layers are fused to each other. However, the exterior member may be one in which two laminated films are bonded to each other with an adhesive or the like. The fusion layer is formed of, for example, a film of an olefin resin such as polyethylene, polypropylene, modified polyethylene, modified polypropylene, polymers thereof, and the like. The metal layer is formed of, for example, an aluminum foil, a stainless steel foil, a nickel foil, or the like. A surface protective layer is made of, for example, nylon, polyethylene terephthalate, or the like. Among them, the exterior member is preferably an aluminum laminated film in which a polyethylene film, an aluminum foil, and a nylon film are laminated in this order. However, the exterior member may be a laminated film having another laminated structure, a polymer film of polypropylene or the like, or a metal film.

Components in the case where the secondary battery according to the present disclosure including the preferred form and configuration described above is a lithium ion secondary battery in which the capacity of the anode member can be obtained by occluding and releasing lithium which is an electrode reactant will be described below.

In the lithium ion secondary battery, a cathode active material can include lithium atoms. In the cathode member, a cathode active material layer is formed on one surface or both surfaces of a cathode current collector. Examples of the material which forms the cathode current collector can include copper (Cu), aluminum (Al), nickel (Ni), magnesium (Mg), titanium (Ti), iron (Fe), cobalt (Co), zinc (Zn), germanium (Ge), indium (In), gold (Au), platinum (Pt), silver (Ag), palladium (Pd), or the like, or alloys containing any of these, or a conductive material such as stainless steel. The cathode active material layer contains, as the cathode active material, a cathode material capable of occluding and releasing lithium. The cathode active material layer may further contain a cathode binder, a cathode conductive agent, or the like. Examples of the cathode material can include a lithium-containing compound (compound containing a lithium atom), and from the viewpoint of obtaining a high energy density, it is preferable to use a lithium-containing composite oxide and a lithium-containing phosphate compound. The lithium-containing composite oxide is an oxide containing lithium and one or two or more elements (hereinafter referred to as "other elements", however, lithium is excluded) as a constituent element, and has a layered rock salt type crystal structure or a spinel type crystal structure. Specifically, examples of the lithium-containing composite oxide can include lithium-cobalt-based materials, lithium-nickel-based materials, spinel manganese-based materials, and superlattice structure materials. Alternatively, the lithium-containing phosphate compound is a phosphate compound containing lithium and one or two or more elements (other elements) as constituent elements, and has an olivine type crystal structure.

In the anode member, an anode active material layer is formed on one surface or both surfaces of an anode current collector. Examples of the material which forms the anode current collector can include copper (Cu), aluminum (Al), nickel (Ni), magnesium (Mg), titanium (Ti), iron (Fe), cobalt (Co), zinc (Zn), germanium (Ge), indium (In), gold (Au), platinum (Pt), silver (Ag), palladium (Pd), or the like, or alloys containing any of these, or a conductive material such as stainless steel. The anode active material layer contains, as the anode active material, an anode material capable of occluding and releasing lithium. The anode active material layer may further contain an anode binder, an anode conductive agent, or the like. The anode binder and the anode conductive agent can be the same as the cathode binder and the cathode conductive agent.

Examples of the material which forms the anode active material layer can include a carbon material. The carbon material can stably obtain a high energy density because the change in the crystal structure is extremely small at the time of occluding and releasing lithium. In addition, since the carbon material also functions as the anode conductive agent, the conductivity of the anode active material layer is improved. Examples of the carbon material include graphitizable carbon (soft carbon), non-graphitizable carbon (hard carbon), graphite, a high crystalline carbon material in which crystal structure is developed, and the like. However, a surface spacing of (002) plane in the non-graphitizable carbon is preferably 0.37 nm or more, and a surface spacing of the (002) plane in graphite is preferably 0.34 nm or less. More specifically, examples of the carbon material can include pyrolytic carbons; cokes such as pitch coke, needle coke, and petroleum coke; graphite; glassy carbon fibers; an organic polymer compound fired body which can be obtained by firing (carbonizing) polymer compounds, such as a phenol resin and a furan resin, at appropriate temperature; carbon fiber; activated carbon; carbon blacks; polymers such as polyacetylene, and the like. In addition, examples of the carbon material can include low crystalline carbon which is heat-treated at a temperature of about 1000° C., or lower, amorphous carbon or the like. The shape of the carbon material may be any of fibrous, spherical, granular and scaly shapes.

Alternatively, examples of the material forming the anode active material layer can include a material (hereinafter referred to as "metal-based materials") containing one or two or more of any of metal elements and metalloid elements as constituent elements, such that it is possible to obtain a high energy density. The metal-based material may be any of a single substance, an alloy, and a compound, a material containing two or more thereof, or a material at least partially having phases of one or two or more thereof. The alloy contains a material including one or more metal elements and one or more metalloid elements, as well as a material including two or more metal elements. In addition, the alloy may also contain nonmetallic elements. Examples of the structure of the metal-based material can include a solid solution, a eutectic (eutectic mixture), an intermetallic compound, and a coexisting substance of two or more thereof.

Examples of the metal element and the metalloid element can include metal elements and metalloid elements capable of forming an alloy with lithium. Specifically, for example, magnesium (Mg), boron (B), aluminum (Al), gallium (Ga), indium (In), silicon (Si), germanium (Ge), tin (Sn), lead (Pb), antimony (Sb), bismuth (Bi), cadmium (Cd), silver (Ag), zinc (Zn), hafnium (Hf), zirconium (Zr), yttrium (Y), palladium (Pd), and platinum (Pt) can be exemplified, but among them, silicon (Si) and tin (Sn) are preferable from the viewpoint of excellent ability to occlude and release lithium and obtaining an extremely high energy density.

Examples of the material containing silicon as a constituent element include a single substance of silicon, a silicon alloy, and a silicon compound, a material containing two or more thereof, or a material at least partially having phases of one or two or more thereof. Examples of the material containing tin as a constituent element include a single substance of tin, a tin alloy, and a silicon compound, a material containing two or more thereof, or a material at least partially having phases of one or two or more thereof. The term "single substance" means a single substance in a general sense, and may contain trace impurities, and does not necessarily mean 100% purity.

In addition, examples of the material forming the anode active material layer include metal oxides such as iron oxide, ruthenium oxide, and molybdenum oxide; and polymer compounds such as polyacetylene, polyaniline, and polypyrrole.

Among them, the material forming the anode active material layer preferably contains both a carbon material and a metal-based material for the following reasons. That is, the metal-based material, in particular, a material containing at least one of silicon and tin as a constituent element has an advantage of high theoretical capacity, but tends to sharply expand and contract during the charging and discharging.

On the other hand, the carbon materials have low theoretical capacity, but have an advantage of being difficult to expand and contract during the charging and discharging. Therefore, by using both the carbon material and the metal-based material, the expansion and contraction can be suppressed during the charging and discharging while the high theoretical capacity (in other words, battery capacity) is obtained.

A surface of the anode current collector is preferably roughened from the viewpoint of improving the adhesion of the anode active material layer to the anode current collector based on a so-called anchor effect. In this case, at least the surface of the region of the anode current collector where the anode active material layer is to be formed may be roughened. Examples the roughening method can include a method of forming fine particles using electrolytic treatment. The electrolytic treatment is a method of forming irregularities on a surface of an anode current collector by forming fine particles on the surface of the anode current collector using an electrolytic method in an electrolytic cell.

The anode active material layer can be formed, for example, based on a coating method, a vapor phase method, a liquid phase method, a thermal spraying method, and a firing method (sintering method). The coating method is a method of mixing a particulate (powdered) anode active material with an anode binder and the like, dispersing a mixture in a solvent such as an organic solvent, and coating the mixture to an anode current collector. The vapor phase method includes a physical vapor deposition method (PVD method) such as a vacuum evaporation method, a sputtering method, an ion plating method, and a laser ablation method, or various chemical vapor deposition methods (CVD methods) including a plasma CVD method. Examples of the liquid phase method include an electrolytic plating method or an electroless plating method. The thermal spraying method is a method of spraying a molten or semi-molten anode active material onto an anode current collector. The firing method include a method of coating a mixture dispersed in a solvent to an anode current collector using a coating method and then performing heat treatment at a temperature higher than a melting point of an anode binder and the like, and examples of the firing method can include an atmosphere firing method, a reaction firing method, and a hot press firing method.

Alternatively, the anode member can be formed of a lithium foil, a lithium sheet, or a lithium plate.

Specifically, examples of the binder in the cathode member and the anode member can include polymer materials such as synthetic rubbers such as styrene butadiene-based rubber, fluorine-based rubber, ethylene propylene diene; fluorine-based resins such as polyvinylidene fluoride, polyvinyl fluoride, polyimide, and polytetrafluoroethylene. In addition, examples of the conductive agent in the cathode member and the anode member can include carbon materials such as graphite, carbon black, graphite, acetylene black, and ketjen black, but can include metal materials, conductive polymers, and the like as long as they are a conductive material.

The chargeable capacity of the anode member is preferably larger than the discharge capacity of the cathode member in order to prevent lithium from being unintentionally precipitated on the anode member during the charging. That is, an electrochemical equivalent of the anode material capable of occluding and releasing lithium is preferably larger than that of the cathode material. The lithium precipitated on the anode member is, for example, lithium metal when the electrode reactant is lithium.

A cathode lead portion can be attached to the cathode current collector by spot welding or ultrasonic welding. The cathode lead portion is preferably a metal foil or a mesh shape, but is electrochemically and chemically stable and may not necessarily be made of metal as long as it is conducted. Examples of the material for the cathode lead portion can include aluminum (Al), and the like. An anode lead portion can be attached to the anode current collector by the spot welding or the ultrasonic welding. The anode lead portion is preferably a metal foil or a mesh shape, but is electrochemically and chemically stable and may not necessarily be made of metal as long as it is conducted. Examples of the material for the anode lead portion can include copper (Cu), nickel (Ni), and the like.

The separator separates the cathode member and the anode member, and passes through lithium ions while preventing a short circuit of current caused by the contact of the cathode member and the anode member. Examples of the separator include a porous film made of a synthetic resin such as a polyolefin-based resin (polypropylene resin or polyethylene resin), a polyimide resin, a polytetrafluoroethylene resin, a polyvinylidene fluoride resin, a polyphenylene sulfide resin, and an aromatic polyamide; a porous film made of ceramic or the like; a glass fiber: non-woven fabric made of a liquid crystalline polyester fiber, an aromatic polyamide fiber, a cellulosic fiber, non-woven fabric made of ceramic, and the like, but among them, the porous film made of polypropylene and polyethylene is preferable. Alternatively, the separator can be formed of a laminated film in which two or more types of porous films are laminated, or may be a separator coated with an inorganic material layer or an inorganic matter-containing separator. A thickness of the separator is preferably 5 μm or more and 50 μm or less, and more preferably 7 μm or more and 30 μm or less. When the thickness of the separator is too large, a filling amount of the active material is reduced to reduce the battery capacity, and the ion conductivity is lowered to cause deterioration in current characteristics. Conversely, if the thickness of the separator is too thin, the mechanical strength of the separator is reduced.

Examples of lithium salt which forms a non-aqueous electrolytic solution suitable for use in the lithium ion secondary battery can include $LiPF_6$, $LiClO_4$, $LiBF_4$, $LiAsF_6$, $LiSbF_6$, $LiTaF_6$, $LiNbF_6$, $LiAlCl_4$, $LiCF_3SO_3$, $LiCH_3SO_3$, $LiN(CF_3SO_2)_2$, $LiC(CF_3SO_2)_3$, $LiC_4F_9SO_3$, $Li(FSO_2)_2N$, $Li(CF_3SO_2)_2N$, $Li(C_2F_5SO_2)_2N$, $Li(CF_3SO_2)_3C$, $LiBF_3(C_2F_5)$, $LiB(C_2O_4)_2$, $LiB(C_6F_5)_4$, $LiPF_3(C_2F_5)_3$, $½Li_2B_{12}F_{12}$, $Li_2SiF_6$, $LiCl$, $LiBr$, $LiI$, but are not limited thereto. In addition, examples of the organic solvent include cyclic carbonates such as ethylene carbonate (EC), propylene carbonate (PC) and butylene carbonate (BC); chain carbonates such as dimethyl carbonate (DMC), ethyl methyl carbonate (EMC), diethyl carbonate (DEC), dipropyl carbonate (DPC), propyl methyl carbonate (PMC), and propyl ethyl carbonate (PEC); cyclic ethers such as tetrahydrofuran (THF), 2-methyltetrahydrofuran (2-MeTHF), 1,3 dioxolane (DOL), and 4-methyl-1,3 dioxolane (4-MeDOL); linear ethers such as 1,2 dimethoxyethane (DME) and 1,2 diethoxyethane (DEE); cyclic esters such as γ-butyrolactone (GBL) and γ-valerolactone (GVL); and chain esters such as methyl acetate, ethyl acetate, propyl acetate, methyl formate, ethyl formate, propyl formate, methyl butyrate, methyl propionate, ethyl propionate, and propyl propionate. Alternatively, examples of the organic solvent include tetrahydropyran, 1,3 dioxane, 1,4 dioxane, N,N-dimethylformamide (DMF), N,N-dimethylacetamide (DMA), N-methyl pyrrolidinone (NMP), N-methyl oxazolidinone (NMO), N,N'-dimethylimidazolidinone (DMI), dimethyl sulfoxide (DMSO), trimethyl phosphate (TMP), nitromethane (NM), nitroethane (NE), sulfolane (SL), methyl sulfolane, acetonitrile (AN), anisole, propionitrile, glutaronitrile (GLN), adiponitrile (ADN), methoxyacetonitrile (MAN), 3-methoxypropionitrile (MPN), and diethyl ether. Alternatively, ionic liquids can also be used. The conventionally known ionic liquid can be used as an ionic liquid, and may be selected as necessary.

A gel-like electrolyte can also be formed of a non-aqueous electrolytic solution and a polymer compound for holding. The non-aqueous electrolytic solution is held, for example, by a polymer compound for holding. While the gel-like electrolyte in such a form obtains high ion conductivity (for example, 1 mS/cm or more at room temperature), the liquid leakage of the non-aqueous electrolytic solution is prevented. In some cases, the electrolyte can also be a non-aqueous liquid electrolyte.

Specific examples of the polymer compound for holding include polyacrylonitrile, polyvinylidene fluoride, polytetrafluoroethylene, polyhexafluoropropylene, polyethylene oxide, polypropylene oxide, polyphosphazene, polysiloxane, polyvinyl fluoride (PVF), and polychlorotrifluoroethylene (PCTFE), perfluoroalkoxy alkane (PFA), a tetrafluoroethylene-hexafluoropropylene copolymer (FEP), a tetrafluoroethylene-hexafluoropropylene copolymer (ETFE), an ethylene-chlorotrifluoroethylene copolymer (ECTFE), polyvinyl acetate, polyvinyl alcohol, polymethyl methacrylate, polyacrylic acid, polymethacrylic acid, styrene-butadiene rubber, nitrile-butadiene rubber, polystyrene, polycarbonate, and polyvinyl chloride. These may be used alone or in combination. Also, the polymer compound for holding may also be a copolymer. Specific examples of the copolymer include copolymers such as vinylidene fluoride and hexafluoropropylene, but among them, from the viewpoint of electrochemical stability, polyvinylidene fluoride as a homopolymer is preferable and as the copolymer, copolymers such as vinylidene fluoride and hexafluoropropylene is preferable. In addition, examples of a filler may include $Al_2O_3$, $SiO_2$, $TiO_2$, and BN (a highly heat resistant compound such as boron nitride).

Specific examples of a solid electrolyte layer having lithium ion conductivity include a lithium super ion conductor (LISICON), for example, a sodium super ion conductor (NASICON) such as LATP or LAGP, a beta iron sulfate-type ion conductor, $\gamma$-$Li_3PO_4$-type oxoate (for example, $LiM_2(PO_4)_3$ or LIPON), NASICON-type phosphate, perovskite-type titanate such as LLT, and thio-LISICON-type lithium ion conductor. Alternatively, the solid electrolyte layer having lithium ion conductivity can be obtained by an acid-base reaction between a glass forming compound (compounds which can be vitrified alone, specifically, $SiO_2$, $B_2O_3$, $P_2O_5$, $P_2S_5$, $SiS_2$, $B_2S_3$, $GeS_2$, $Al_2O_3$, $GeO_2$, $La_2O_3$, $Y_2O_3$, $Ta_2O_5$, $Nb_2O_5$, $TiO_2$, $V_2O_5$, $WO_3$, $ZrO_2$, SnO, ZnO, CaO, BaO, and the like) and a modified compound (compounds which are not vitrified alone but can be vitrified by being combined with the glass forming compound, and specific examples thereof include $LiO_2$, $Li_2S$, $Li_3N$, $Na_2O$, and the like), and can also include oxysulfide-based glass. Alternatively, not only the oxide-based solid electrolyte but also a sulfide-based solid electrolyte (for example, an LGPS-based solid electrolyte such as $Li_{10}GeP_2S_{12}$, $Li_{9.5}Si_{1.74}P_{1.44}S_{11.7}C_{10.3}$ and the like) can be used.

The secondary battery and the like in the present disclosure can be used as a driving power supply or an auxiliary power supply of, for example, a personal computer, various display devices, portable information terminals including personal digital assistant (PAD), a mobile phone, a smartphone, a base unit or a cordless extension unit of a cordless phone, a video movie (video camera or camcorder), a digital still camera, electric paper such as an electronic book or an electronic newspaper, an electronic dictionary, a music player, a portable music player, a radio, a portable radio, a headphone, a headphone stereo, a game machine, a navigation system, a memory card, a cardiac pacemaker, a hearing aid, an electric tool, an electric shaver, a refrigerator, an air conditioner, a television receiver, a stereo, a water heater, a microwave oven, a dishwasher, a washing machine, a dryer, a lighting device including a room light and the like, various electric devices (including portable electronic devices), a toy, a medical device, a robot, a road conditioner, a traffic light, a railway car, a golf cart, an electric cart, an electric vehicle (including a hybrid vehicle), and the like. In addition, the secondary battery can be mounted on a power supply for storing electricity and the like for a building including a house or a power generation facility or can be used to supply power thereto.

A secondary battery, a control means for performing control related to the secondary battery, and a control means in a secondary battery pack having an exterior member including the secondary battery can include a charge and discharge control device according to the first to third aspects of the present disclosure. In addition, the secondary battery in the electronic device which receives the supply of power from the secondary battery can include the charge and discharge control device according to the first to third aspects of the present disclosure.

A control device in an electric motor vehicle including a conversion device which receives a supply of power from a secondary battery and converts the received power into a driving force of a vehicle and a controller which performs information processing related to vehicle control based on information on the secondary battery can include the charge and discharge control device according to the first to third aspects of the present disclosure. In this electric motor vehicle, the conversion device is typically supplied with power from the secondary battery to drive a motor so as to generate a driving force. Regenerative energy can also be used to drive the motor. In addition, the control device performs the information processing related to the vehicle control, for example, based on the remaining amount of the secondary battery. The electric motor vehicle includes, for example, a so-called hybrid vehicle in addition to an electric vehicle, an electric motorcycle, an electric bicycle, a railway vehicle and the like.

The secondary battery can also be used in a power storage device in a so-called smart grid. Such a power storage device cannot only supply power but also store power by receiving a supply of power from another power source. The power storage device can include the charge and discharge control device according to the first to third aspects of the present disclosure. As other power sources, for example, thermal power generation, nuclear power generation, hydroelectric power generation, a solar cell, wind power generation, geothermal power generation, a fuel cell (including biofuel cell) and the like can be used.

A power storage system (or a power supply system) configured to receive a supply of power from a secondary battery and/or supply power from a power source to a secondary battery can include a secondary battery and the charge and discharge control device according to the first to third aspects. Any power storage system may be used as long as the power storage system substantially uses power, and also includes a mere power device. The power storage system includes, for example, a smart grid, a home energy management system (HEMS), a vehicle, and the like, and can also store power.

A power supply for power storage which is configured to include a secondary battery and be connected to an electronic device to which power is supplied can include a secondary battery and a charge and discharge control device according to the first to third aspects of the present disclosure. The power supply for power storage can be basically used for any power storage system, a power supply system, or a power device regardless of the application of the power supply for power storage, but can be used for a smart grid, for example.

EXAMPLE 1

Example 1 relates to a method of charging and discharging a secondary battery of the present disclosure, and a charge and discharge control device according to a first aspect of the present disclosure.

Figure 1B:
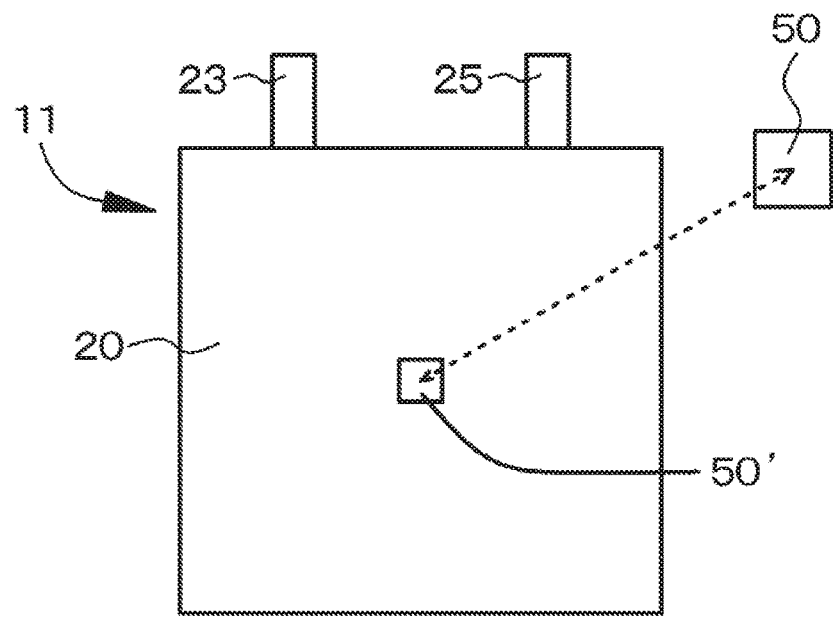

As illustrated as a conceptual diagram in FIG. 1A, a charge and discharge control device 10A of Example 1 includes:

a secondary battery 11 that includes one or a plurality of sensors 50 detecting an amount of displacement which occurring in a secondary battery due to charging and discharging; and a controller 40A that controls a charging and discharging current of the secondary battery 11 based on the detection result of each of the sensor 50. The controller 40A controls the charging and discharging current of the secondary battery 11 so that the amount of displacement of the secondary battery 11 does not exceed a predetermined threshold value. Specifically, in the Example 1, a charging current $I_C$ is controlled. In addition, in the example illustrated in FIG. 1A, one sensor 50 is provided. In FIGS. 1A and 5 to 12, a flow of current is indicated by a solid line, and a flow of signals and the like is indicated by a dotted line. In addition, a top view of the secondary battery 11 is illustrated in FIG. 1B.

The secondary battery 11 has a cathode member 22, an anode member 24, a separator 26, and a gel-like electrolyte (gel-like electrolyte layer 28). Alternatively, the secondary battery 11 has a cathode member 22, an anode member 24, and a solid electrolyte layer. The secondary battery 11 in Example 1 is a lithium ion secondary battery. Details of the secondary battery 11 will be described later.

In Example 1, a contactless laser displacement sensor (laser displacement gauge) is used as the sensor 50, and monitors one point on an outer surface of the secondary battery 11. In FIG. 1A, this monitoring point is indicated by reference numeral 50', and a state in which the sensor 50 is disposed outside the secondary battery 11 is schematically illustrated. The sensor 50 is attached to an appropriate portion of a secondary battery holding member (not shown) provided outside the secondary battery 11. A sensor constituted by a strain gauge or the like may be fixed (specifically, bonded) to the outer surface of the secondary battery 11. A displacement occurring in the secondary battery 11 is a distortion of the secondary battery 11 or a change in thickness of the secondary battery 11 (more specifically, in Example 1, thickness).

The lithium ion secondary battery of Example 1 operates, for example, as follows. That is, when lithium ions are released from the cathode member 22 during charging, the lithium ions are occluded by the anode member 24 through the gel-like electrolyte layer 28. On the other hand, when lithium ions are released from the anode member 24 during charging, the lithium ions are occluded by the cathode member 22 through the gel-like electrolyte layer 28. If an open circuit voltage (battery voltage) at the time of full charge is designed to be $V_N$ volts (>4.2 volts), the lithium ion secondary battery discharges a larger amount of lithium per unit mass than a case where the open circuit voltage at the time of full charge is designed to be 4.2 volts, even if it uses the same kind of cathode active material. Thus, the amount of the cathode active material and the amount of the anode active material are adjusted, and the lithium ion secondary battery is designed so that the open circuit voltage (battery voltage) at the time of full charge becomes a predetermined voltage (upper limit voltage), thereby obtaining a high energy density.

The charge and discharge control device 10A for controlling the entire operation of the secondary battery 11 includes a controller 40A including a central processing unit (CPU), a memory 41, a switch control unit 42, a switch unit 43, external terminals 44 and 45, a current measuring unit 46, a voltage measuring unit 47, and a DC-DC converter 48.

The switch unit 43 switches a use state of the secondary battery 11 (whether or not the secondary battery 11 is connected to an external device) under the control of the switch control unit 42 according to an instruction from the controller 40A. The switch unit 43 includes, for example, a charge control switch, a discharge control switch, a charging diode, and a discharging diode (none of which are shown). The charge control switch and the discharge control switch are, for example, a semiconductor switch such as a field effect transistor (MOSFET) using a metal oxide semiconductor.

The external terminals 44 and 45 are terminals which are connected to an external device (for example, a personal computer) operated by the secondary battery 11 or an external device (for example, a charger or the like) or the like used for charging the secondary battery 11.

The current measuring unit 46 measures the charging current or the discharging current using a current detection resistor (not shown), and outputs the measured result to the controller 40A. The voltage measuring unit 47 measures the voltage of the secondary battery 11, converts the measured voltage from analog into digital, and outputs the converted voltage to the controller 40A. The DC-DC converter 48 controls the charging current of the secondary battery 11 under the control of the controller 40A.

The sensor 50 attached to the outer surface of the secondary battery 11 is connected to the controller 40A, The result measured by the sensor 50 is used for the control of the charging current. That is, the charging current of the secondary battery 11 is controlled based on the displacement amount measurement result of the sensor 50 under the control of the controller 40A.

The controller 40A controls the operation of the switch unit 43 via the switch control unit 42 according to signals input from the current measurement unit 46 and the voltage measurement unit 47. For example, when a battery voltage reaches an overcharge detection voltage, the switch control unit 42 disconnects the switch unit 43 (charge control switch) to control the charging current not to flow in a current path of the secondary battery 11. By doing so, in the secondary battery 11, the discharging can be made only through the discharging diode. In addition, for example, when a large current flows during charging, the switch control unit 42 cuts off the charging current. In addition, for example, when the battery voltage reaches the overcharge detection voltage, the switch control unit 42 disconnects the switch unit 43 (discharge control switch) to control the discharging current not to flow in the current path of the secondary battery 11. By doing so, in the secondary battery 11, the charging can be made only through the charging diode. In addition, for example, when a large current flows during discharging, the switch control unit 42 cuts off the discharging current.

The memory 41 is, for example, an EEPROM or the like which is a non-volatile memory. The memory 41 stores, for example, numerical values calculated by the controller 40A, information (for example, $S_{Ini}(SOC)$) on the secondary battery 11 measured in a manufacturing process stage, $S_{max}$, or the like.

In a method of charging and discharging a secondary battery according to Example 1, the method of charging and discharging a secondary battery 11 includes detecting a displacement occurring in the secondary battery 11 by one or a plurality of sensors 50 due to charging and discharging, and controlling a charging and discharging current based on the detection result of each of the sensor 50, in which the charging and discharging current of the secondary battery 11 is controlled so that an amount of displacement of the secondary battery 11 does not exceed a predetermined threshold value.

Here, in the charging and discharging method according to Example 1, the charging and discharging current of the secondary battery 11 is reduced so that the amount of displacement of the secondary battery 11 does not exceed the predetermined threshold value. In this case, when the secondary battery 11 is charged, in the secondary battery 11, the charging current $I_C$ of the secondary battery 11 is reduced so that a value of $\Delta S=|S(SOC)-S_{Ini}(SOC)|/S_{max}$, does not exceed a predetermined threshold value.

Here, $S_{Ini}(SOC)$: Amount of displacement obtained using an SOC value as a parameter when the secondary battery 11 is charged to a current value that is k times a reference current value $I_0$ (however, 0<k<1), $S(SOC)$: Amount of displacement obtained using an SOC value as a parameter when the secondary battery 11 is actually charged, and $S_{max}$: Maximum value of the amount of displacement at the time of full charge in a previous time.

Furthermore, in the method of charging and discharging a secondary battery according to Example 1, the predetermined threshold value is defined depending on the range of the SOC value when the secondary battery 11 is charged.

As described above, in the secondary battery, lithium or other transition elements are incorporated into a crystal structure of a material forming an electrode active material during charging and discharging, so a volume of the material forming the electrode active material expands and contracts. In addition, when an excessive stress is applied to the secondary battery, precipitation of metal and the like occurs. In Example 1, for example, an initial stress amount $S_{Ini}$ of the secondary battery 11 during charging at a low charging current value (k times the reference current value $I_0$) is measured in advance. Then, during rapid charging or normal charging, the displacement occurring in the secondary battery 11 such as the distortion or the change in thickness of the secondary battery is detected by the sensor 50, and the charging current of secondary battery 11 is controlled by the DC-DC converter 48 under the control of the controller 40A so that an amount of displacement of the secondary battery 11 does not exceed the predetermined threshold value. By controlling the charging current of the secondary battery 11, the amount of stress applied to the secondary battery 11 is controlled to suppress the discharging capacity from decreasing when a charge and discharge cycle is repeated.

Specifically, k=0.01. In addition, when the secondary battery 11 is charged, the predetermined threshold value is defined depending on the range of the SOC value, but the range of the SOC value and the definition of the threshold value are as follows. However, the range of the SOC value and the threshold value are not limited to these values.

First SOC section . . . 0%≤(threshold value $Th_1$ of $\Delta S$)≤10%, the SOC value is in a section from a to b
where a=0% to 10%, b=30% to 50%, Second SOC section . . . 0%≤(threshold value $Th_2$ of $\Delta S$)≤10%,
the SOC value is in a section from b to c,
where c=40% to 80%, Third SOC section . . . 0%≤(threshold value $Th_3$ of $\Delta S$)≤10%,
the SOC value is in a section from c to d,
where d=60% to 100%

More specifically, in Example 1, the threshold values $Th_1$, $Th_2$, and $Th_3$ of $\Delta S$ and the values of sections a, b, c, and d are as follows.

$Th_1$=3%,
$Th_2$=3%,
$Th_3$=1%,
a=0%,
b=20%,
c=70%,
d=100%

Further, the charging current of the secondary battery 11 is reduced so that the amount of displacement of the secondary battery 11 does not exceed the predetermined threshold value. Specifically, when the secondary battery 11 is charged with the reference current value $I_0$, if the amount of displacement of the secondary battery 11 exceeds the predetermined threshold value, the charging current of the secondary battery 11 is set to the reference current value $I_0 \times \alpha$ (however, for example, 0<α≤0.5). The values of α ($\alpha_1$, $\alpha_2$, and $\alpha_3$) can be obtained based on a method of performing a charge and discharge cycle test with different a for each SOC section, measuring a decrease in a discharge capacity of a secondary battery, and determining an optimal value of α.

Figure 2:
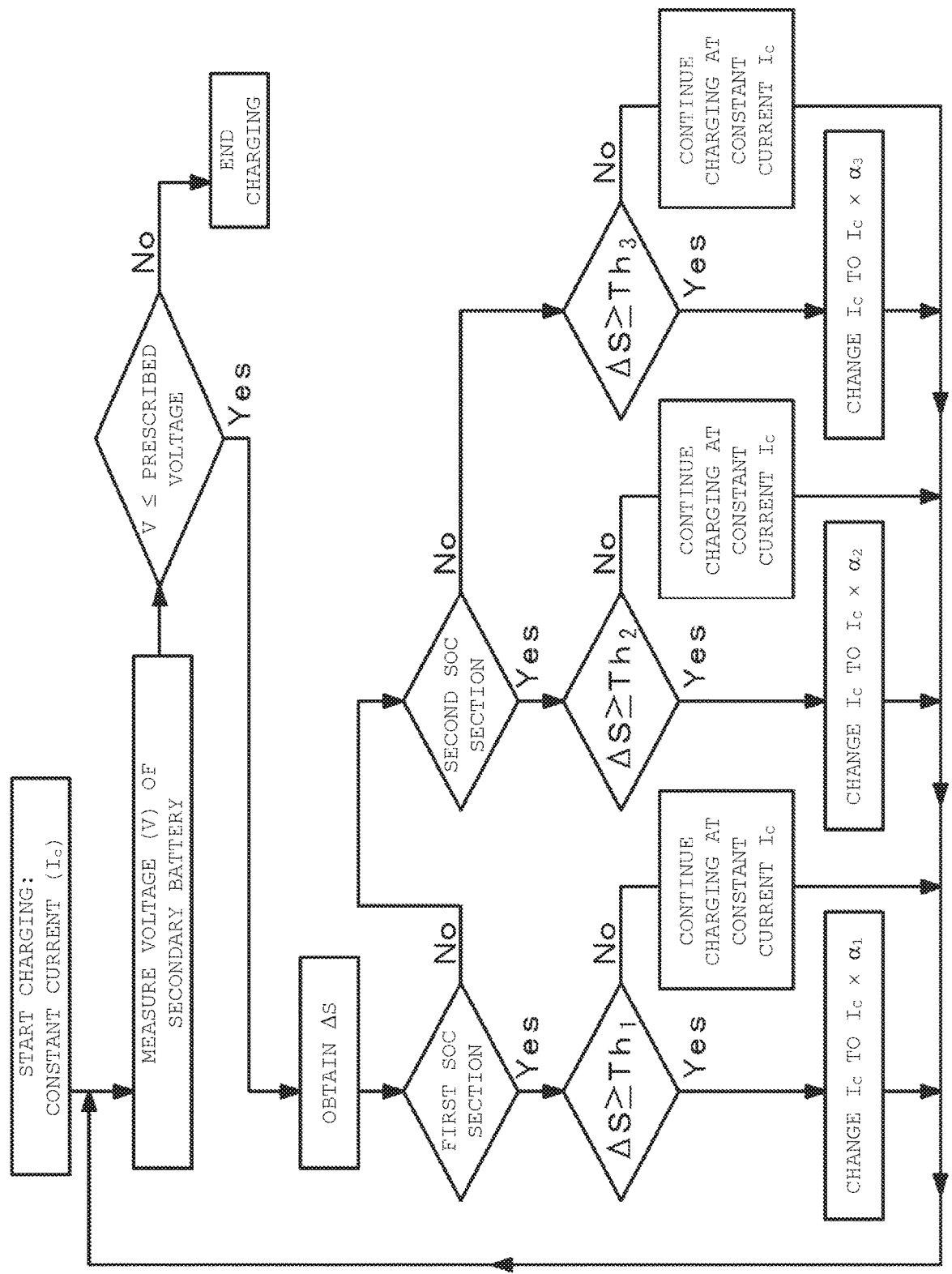
FIG. 2 is a flowchart illustrating a method of charging and discharging a secondary battery according to an embodiment of the present disclosure.

A flow chart of the method of charging and discharging a secondary battery according to Example 1 is illustrated in FIG. 2. Here, α in the first SOC section is represented by "$\alpha_1$", α in the SOC second section is represented by "$\alpha_2$", α in the third SOC third is represented by "$\alpha_3$", and the charging current is represented by $I_C$. In addition, in FIG. 2 or FIGS. 19 and 20 described later, the "specified voltage" refers to a threshold value of voltage, and can be, for example, a use upper limit voltage of the secondary battery.

Figure 3:
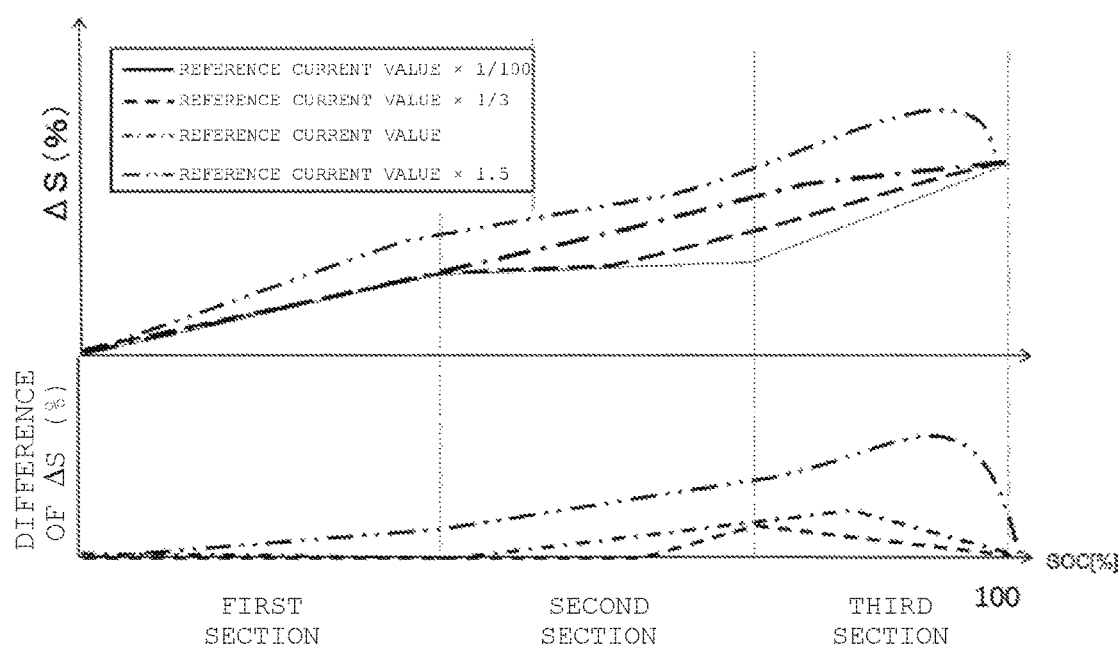
FIG. 3 is a graph showing a change in an amount of displacement obtained using an SOC value as a parameter in the method of charging and discharging a secondary battery according to an embodiment of the present disclosure.

The change in the amount of displacement obtained using the SOC value as a parameter in the first SOC section, the second SOC section, and the third SOC section with a=0%, b=20%, c=70%, and d=100%, specifically, the change in the value of $\Delta S$ ($\Delta S_{1/100}$) when the secondary battery 11 is charged with the reference current value $I_0 \times k$ (k=0.01=1/00), the change in the value of $\Delta S$ ($\Delta S_{1/3}$) when the secondary battery 11 is charged with the reference current value $I_0 \times (\frac{1}{3})$, the change in the value of $\Delta S$ ($\Delta S_1$) when the secondary battery 11 is charged with the reference current value $I_0$, and the change in the value of $\Delta S$ ($\Delta S_{1.5}$) when the secondary battery 11 is charged with the reference current value $I_0 \times 1.5$ are shown in the upper part of FIG. 3 as "$\Delta S$ (%)", and the value of ($\Delta S_{1/3}-\Delta S_{1/100}$), the value of ($\Delta S_1$-

$\Delta S_{1/100}$), and the value of ($\Delta S_{1.5}$-$\Delta S_{1/100}$) are shown in the lower part of FIG. 3 as "difference (%) in $\Delta S$".

Regarding the value of $\Delta S$ ($\Delta S_{1/100}$), the amount of displacement of the secondary battery gradually increases as the SOC value increases. Regarding the value of $\Delta S_{1/3}$, the value of $\Delta S_1$, and the value of $\Delta S_{1.5}$, the higher the charging current value, the larger the value of $\Delta S$.

Figure 4A:
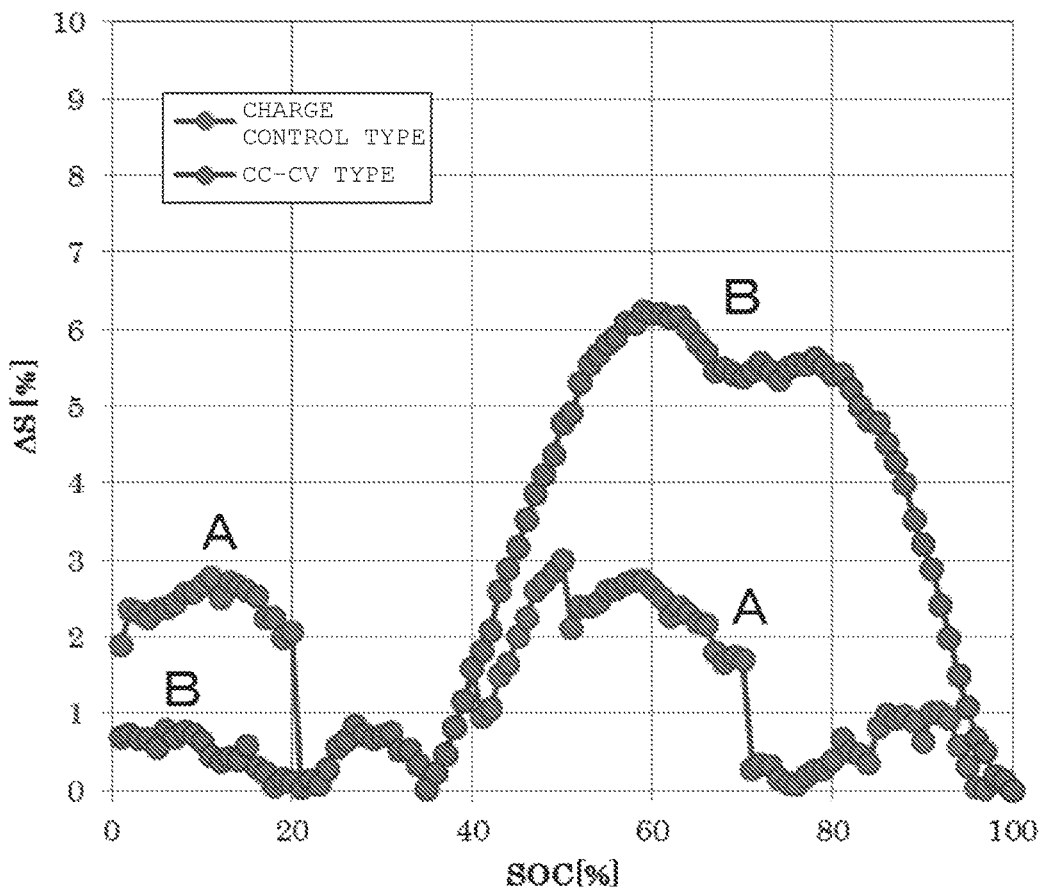
FIGS. 4A and 4B each are graphs showing a relationship between an SOC value and an amount of displacement (ΔS) when the secondary battery is charged and a relationship between an SOC value and a charging current when the secondary batter is charged, based on the method of charging and discharging a secondary battery according to an embodiment of the present disclosure and the charging method of the conventional CC-CV type.
Figure 4B:
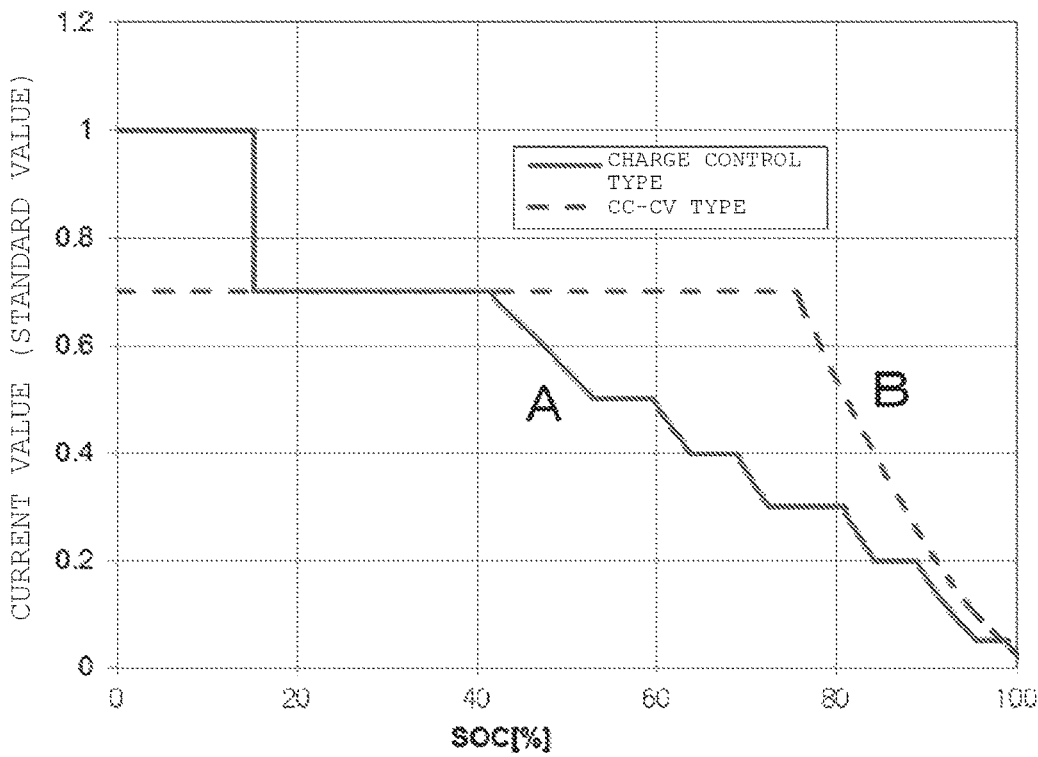

The relationship between the SOC value when the secondary battery 11 is charged and the amount of displacement ($\Delta S$) and the relationship between the SOC value and the charging current based on the method of charging and discharging a secondary battery according to Example 1 and the charging method according to the conventional CC-CV type are each illustrated in FIGS. 4A and 4B. In FIGS. 4A and 4B, "A" is data based on the method of charging and discharging a secondary battery according to Example 1, and "B" is data based on the charging method according to the conventional CC-CV type. In FIG. 4A, data overlap with each other in a section in which the SOC value is 20% to 40%.

Value of discharge capacity retention rate after charging and discharging is performed 100 cycles {=(discharge capacity in hundredth cycle)/(discharge capacity in first cycle)} is as follows, and the discharge capacity retention rate can be improved.

Method of charging and discharging secondary battery according to Example 1: 0.913

Charging method according to conventional CC-CV type: 0.895

The number of sensors 50 is not limited to one, and may be two or more. In this case, the charging and discharging current may be controlled so that among the amounts of displacement detected by a plurality of sensors, a maximum amount of displacement does not exceed a predetermined threshold value. Alternatively, the charging and discharging current may be controlled so that an average value of the amounts of displacement does not exceed a predetermined threshold value, or the charging and discharging current may be controlled so that the maximum amount of displacement does not exceed a first predetermined threshold value and the average value of the amounts of displacement does not exceed a second predetermined threshold value (<first predetermined threshold value). The sensor 50 may be disposed inside the secondary battery 11. When the number of sensors 50 is two or more, all the sensors may be attached to the outer surface of the secondary battery 11, disposed inside the secondary battery 11, or disposed outside the secondary battery 11, and some of the sensors may be attached to the outer surface of the secondary battery 11, and the remaining sensors may be disposed inside the secondary battery 11 or outside the secondary battery 11 and may also be attached/disposed at least two of three locations (outside surface of the secondary battery 11, inside the secondary battery 11, and outside the secondary battery 11).

As described above, in the method of charging and discharging a secondary battery according to Example 1, the displacement occurring in the secondary battery due to the charging and discharging is detected by one or a plurality of sensors to control the charging and discharging current so that the amount of displacement of the secondary current does not exceed the predetermined threshold value, so it is possible to reliably prevent the abnormal displacement occurring in the secondary battery and reliably suppress the secondary battery from deteriorating. In addition, in the charge and discharge control device according to Example 1, the controller controls the charging and discharging current of the secondary battery so that the amount of displacement of the secondary battery does not exceed the predetermined threshold value, so the abnormal displacement can be reliably prevented from occurring in the secondary battery and the deterioration in the secondary battery can be reliably suppressed.

EXAMPLE 2

Example 2 relates to a charge and discharge control device according to a second aspect of the present disclosure. As illustrated as a conceptual diagram in FIGS. 5 to 8, a charge and discharge control device 10B according to Example 2 includes:

a secondary battery pack 12 that includes a plurality of secondary batteries 11 including one or a plurality of sensors 50 detecting amounts of displacement occurring in each of the secondary batteries 11 due to charging and discharging; and a controller 40B that controls a charging and discharging current of the secondary battery pack 12 based on a result detected by a sensor 50, in which the controller 40B controls a charging and discharging current of each of the secondary batteries 11 or the charging and discharging current of the secondary battery pack 12 so that the amounts of displacement of each of the secondary batteries 11 does not exceed a predetermined threshold value. The secondary battery pack 12 or a series and secondary battery unit or a parallel and secondary battery unit is indicated by an alternate long and short dash line.

Figure 5:
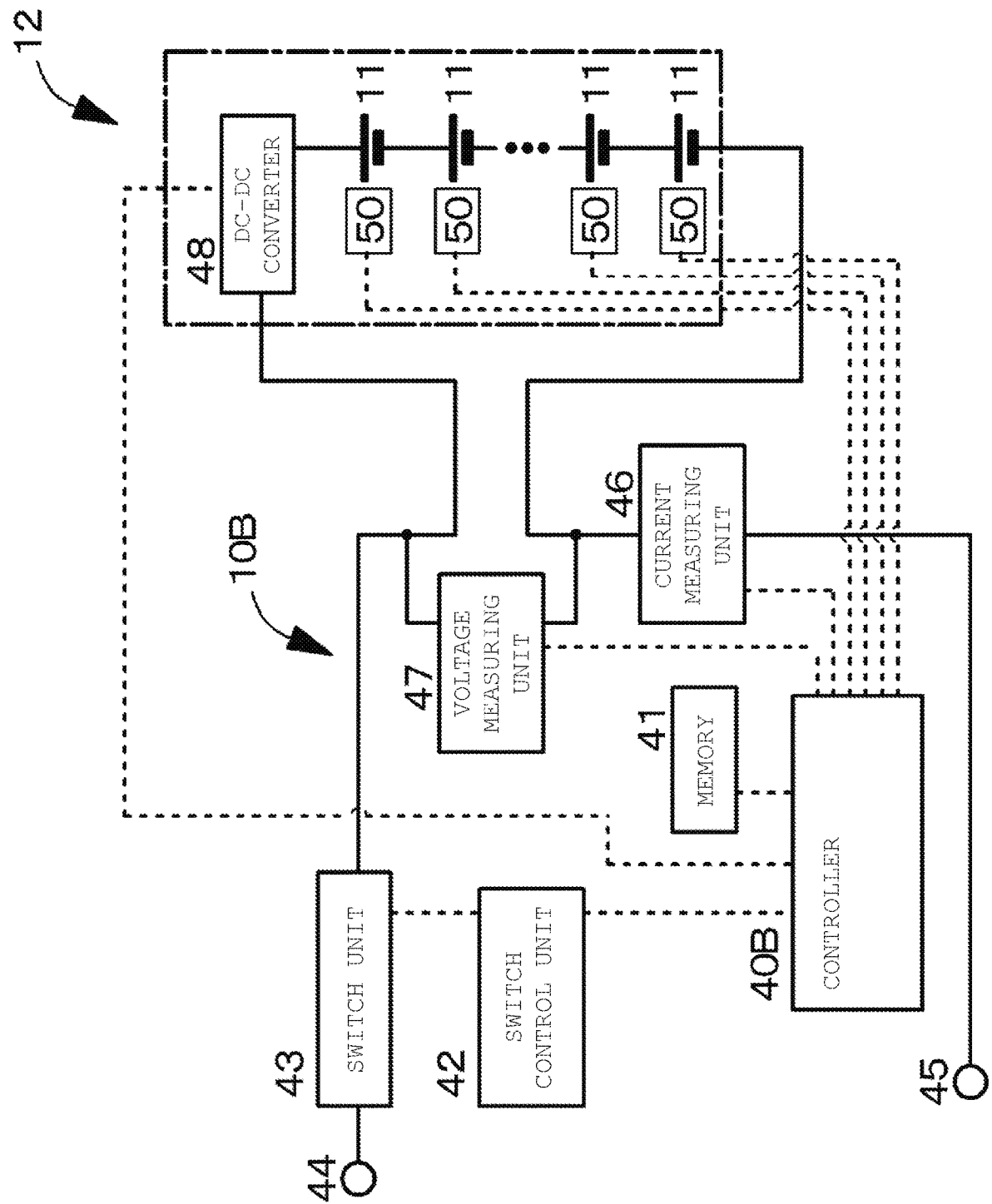
FIG. 5 is a conceptual view of a charge and discharge control device according to an embodiment of the present disclosure.

For example, in the case of the secondary battery pack 12 in which a plurality of secondary batteries are connected in series, as illustrated in FIG. 5, the charging and discharging current of the secondary battery pack 12 is controlled. In addition, in the secondary battery pack 12 in which the plurality of secondary batteries are connected in series, in the step of "determining $\Delta S$" of the flowchart illustrated in FIG. 2, the amount of displacement ($\Delta S$) of each of the plurality of secondary batteries connected in series is obtained, and the charging and discharging current may be controlled so that the maximum amount of displacement among the plurality of amounts of displacement ($\Delta S$) obtained does not exceed the predetermined threshold value. Alternatively, the charging and discharging current may be controlled so that an average value of the amounts of displacement obtained ($\Delta S$) does not exceed a predetermined threshold value, or the charging and discharging current may be controlled so that the maximum amount of displacement does not exceed a first predetermined threshold value and the average value of the amounts of displacement does not exceed a second predetermined threshold value (<first predetermined threshold value). The same applies to the following description of the control of charging and discharging current of the plurality of secondary batteries.

The secondary battery pack 12 is provided with a DC-DC converter 48, and the charging current of the secondary battery pack 12 is controlled by the DC-DC converter 48 under the control of the controller 40A. In some cases, each of the secondary batteries 11 is provided with the DC-DC converter 48, and the charging current of each of the secondary batteries 11 configuring the secondary battery pack 12 may be performed by the DC-DC converter 48 under the control of the controller 40A. The DC-DC converter 48 may be integrally disposed with the secondary battery packs 12 and 13 (or the series and secondary battery units 12A and 13A or the parallel and secondary battery units 12B and 13B described later), and may be separately provided.

Figure 6:
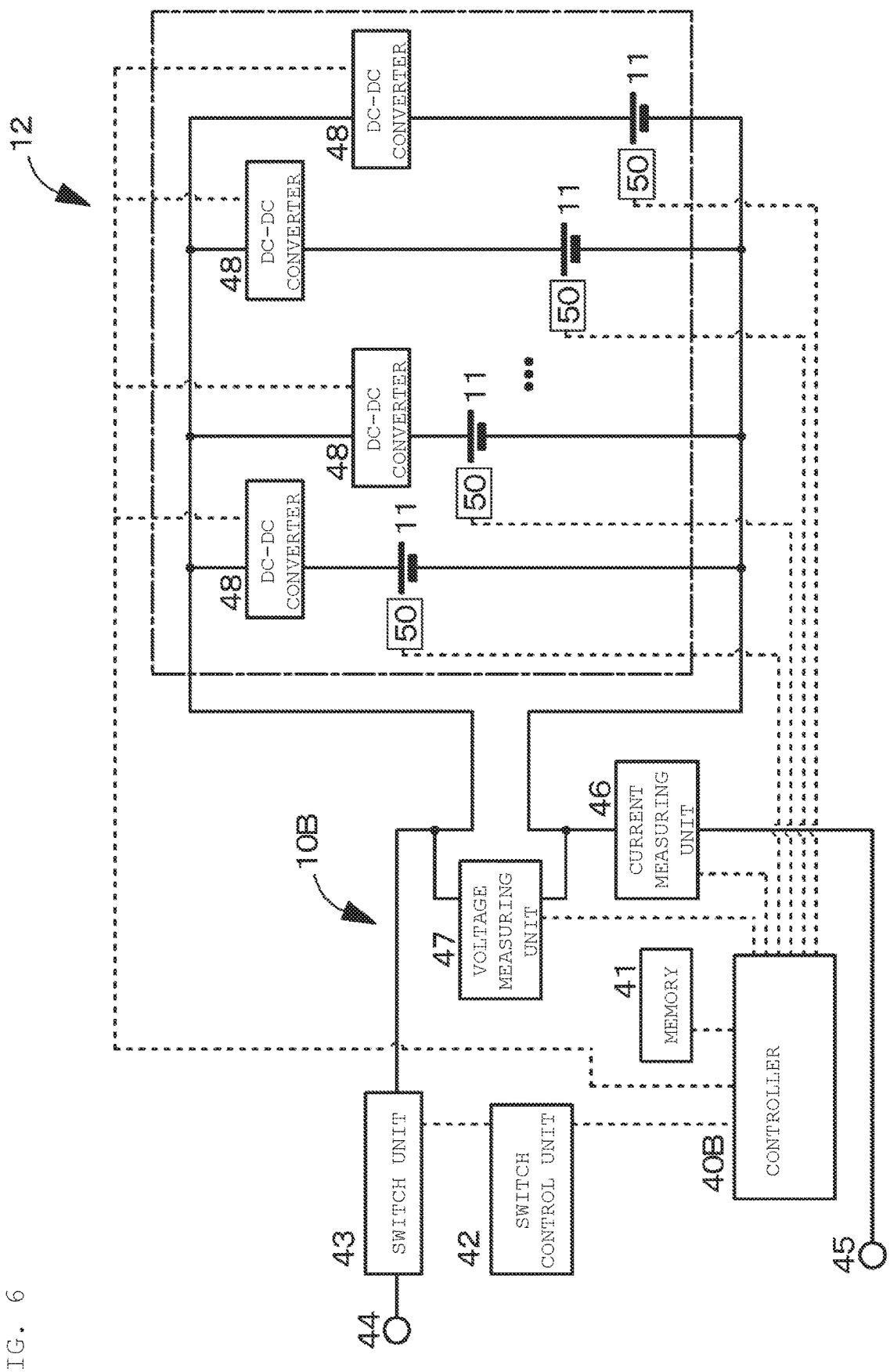
FIG. 6 is a conceptual view of a modified example of the charge and discharge control device according to an embodiment of the present disclosure.

In addition, in the secondary battery pack 12 in which the plurality of secondary batteries are connected in parallel, as illustrated in FIG. 6, the charging and discharging current of each of the secondary batteries 11 is controlled. Each of the secondary batteries 11 is provided with the DC-DC converter 48, and the charging current of each of the secondary batteries 11 configuring the secondary battery pack 12 is controlled by the DC-DC converter 48 under the control of the controller 40A. In some cases, the secondary battery pack 12 is provided with the DC-DC converter 48, and the charging current of the secondary battery pack 12 may be controlled by the DC-DC converter 48 under the control of the controller 40A.

Figure 7:
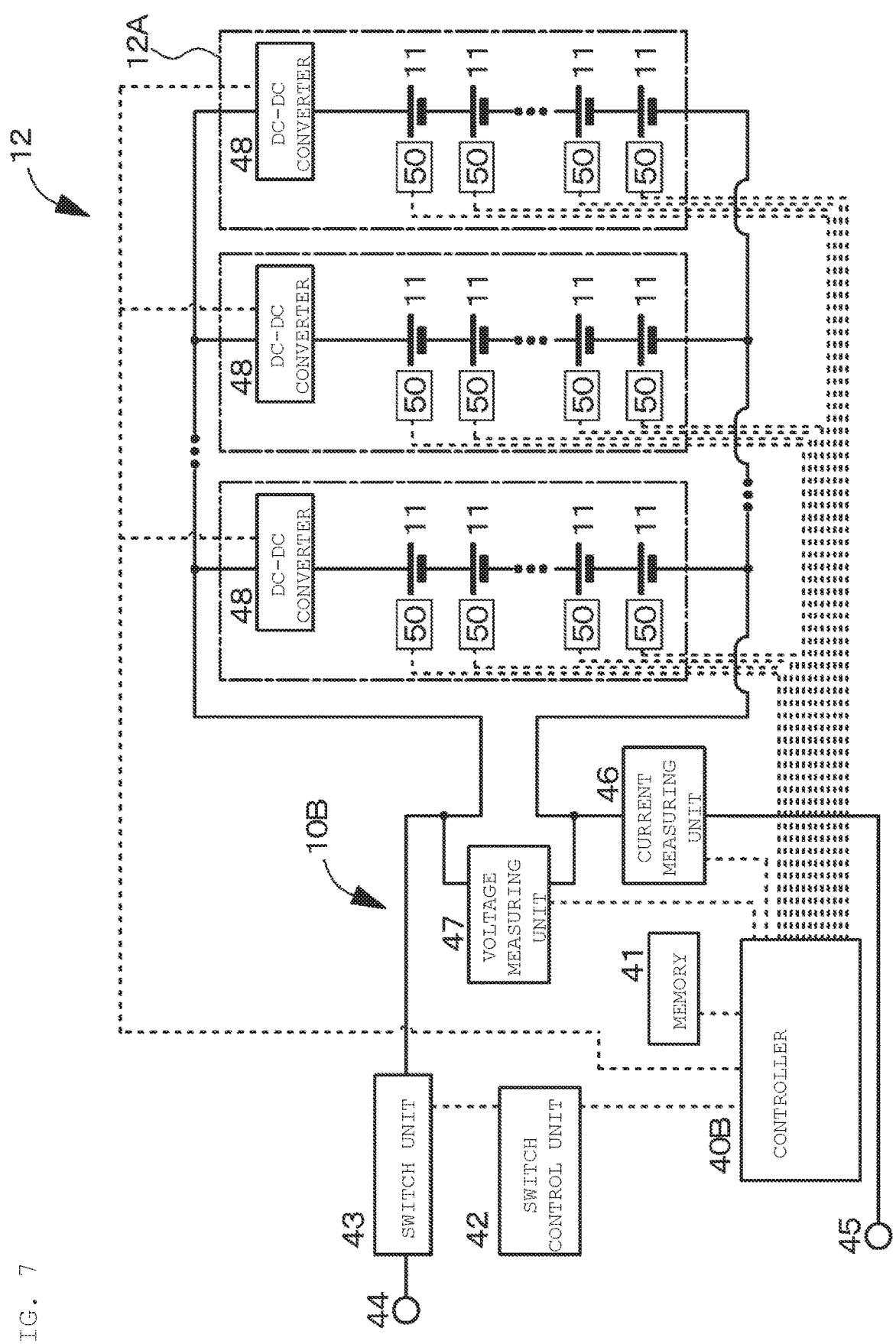
FIG. 7 is a conceptual view of another modified example of the charge and discharge control device according to an embodiment of the present disclosure.

Alternatively, in the secondary battery pack 12 in which a plurality of sets (series and secondary battery units 12A) of secondary batteries connected in series is connected in parallel, as illustrated in FIG. 7, each of the series and secondary battery units 12A configuring the secondary battery pack 12 is provided with the DC-DC converter 48, and the charging current of the series and secondary battery unit 12A is controlled by the DC-DC converter 48 under the control of the controller 40A. In some cases, each of the secondary batteries 11 is provided with the DC-DC converter 48, and the charging current of each of the secondary batteries 11 configuring the secondary battery pack 12 may be performed by the DC-DC converter 48 under the control of the controller 40A.

Figure 8:
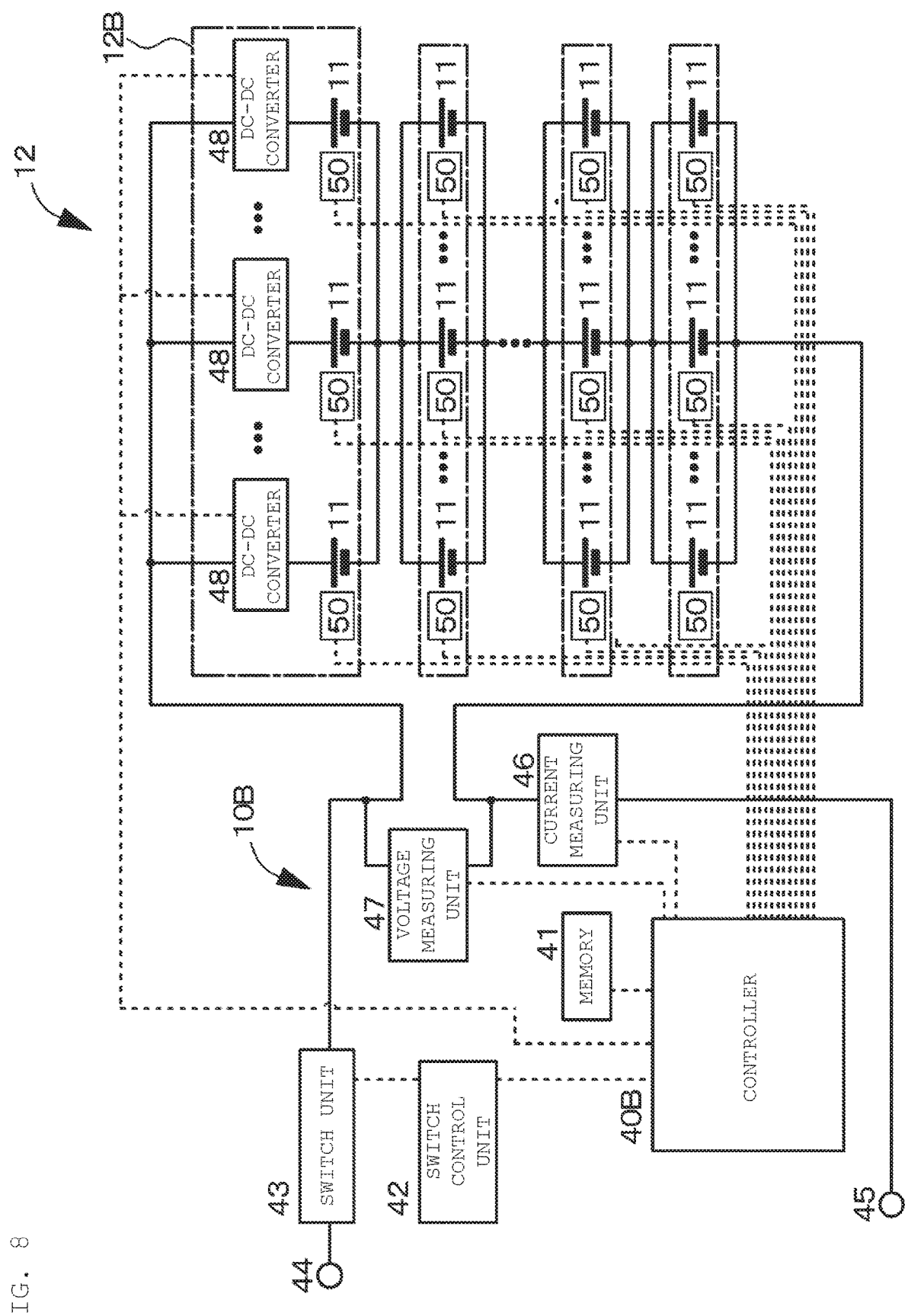
FIG. 8 is a conceptual view of still another modified example of the charge and discharge control device according to an embodiment of the present disclosure.

Alternatively, in the secondary battery pack 12 in which a plurality of sets (parallel and secondary battery units 12B) of secondary batteries connected in parallel are connected in series, as illustrated in FIG. 8, each of the secondary batteries 11 of the parallel and secondary battery units 12B configuring the secondary battery pack 12 is provided with the DC-DC converter 48, and the charging current of each of the secondary batteries 11 is controlled by the DC-DC converter 48 under the control of the controller 40A. In some cases, the parallel and secondary battery units 12B are provided with the DC-DC converters 48, and the charging current of the secondary battery unit 12B may be controlled by the DC-DC converter 48 under the control of the controller 40A. Here, in FIG. 8 or FIG. 12 to be described later, the DC-DC converter 48 is illustrated only for one parallel and secondary battery unit 12B, but the DC-DC converter 48 is also provided for other parallel and secondary battery units 12B.

In the charge and discharge control device according to Example 2, the controller controls the charging and discharging current of each of the secondary batteries so that the amounts of displacement of each of the secondary batteries do not exceed the predetermined threshold value, so the abnormal displacement can be reliably prevented from occurring in the secondary battery and the deterioration in the secondary battery can be reliably suppressed.

EXAMPLE 3

Example 3 relates to a charge and discharge control device according to a third aspect of the present disclosure. As illustrated as conceptual diagrams in FIGS. 9 to 12, a charge and discharge control device 10C according to Example 3 includes:

a secondary battery pack 13 that includes a plurality of secondary batteries 11 and one or a plurality of sensors 50 detecting an amount of displacement occurring in the secondary battery pack 13 due to charging and discharging; and a controller 40C that controls a charging and discharging current of the secondary battery pack 13 based on the detection result of each of the sensors 50, in which the controller 40C controls the charging and discharging current of the secondary battery pack 13 so that the amount of displacement of the secondary battery pack 13 does not exceed a predetermined threshold value.

In the charge and discharge control device 10C according to Example 3, the amount of displacement occurring in the secondary battery pack 13 due to the charging and discharging is detected by the sensor 50, but the secondary battery pack 13 including a plurality of secondary batteries 11 is held by, for example, a secondary battery pack holding member 14. As a result of transmitting the displacement occurring in the secondary battery pack 13 due to the charging and discharging to the secondary battery holding member 14, a distortion, a stress, or a pressure occurs in the secondary battery holding member 14, but the distortion, stress, or pressure is detected by the sensor 50. The secondary battery pack holding member 14 is illustrated only in FIG. 9, and the secondary battery pack holding member 14 is not illustrated in FIGS. 10, 11, and 12.

Figure 9:
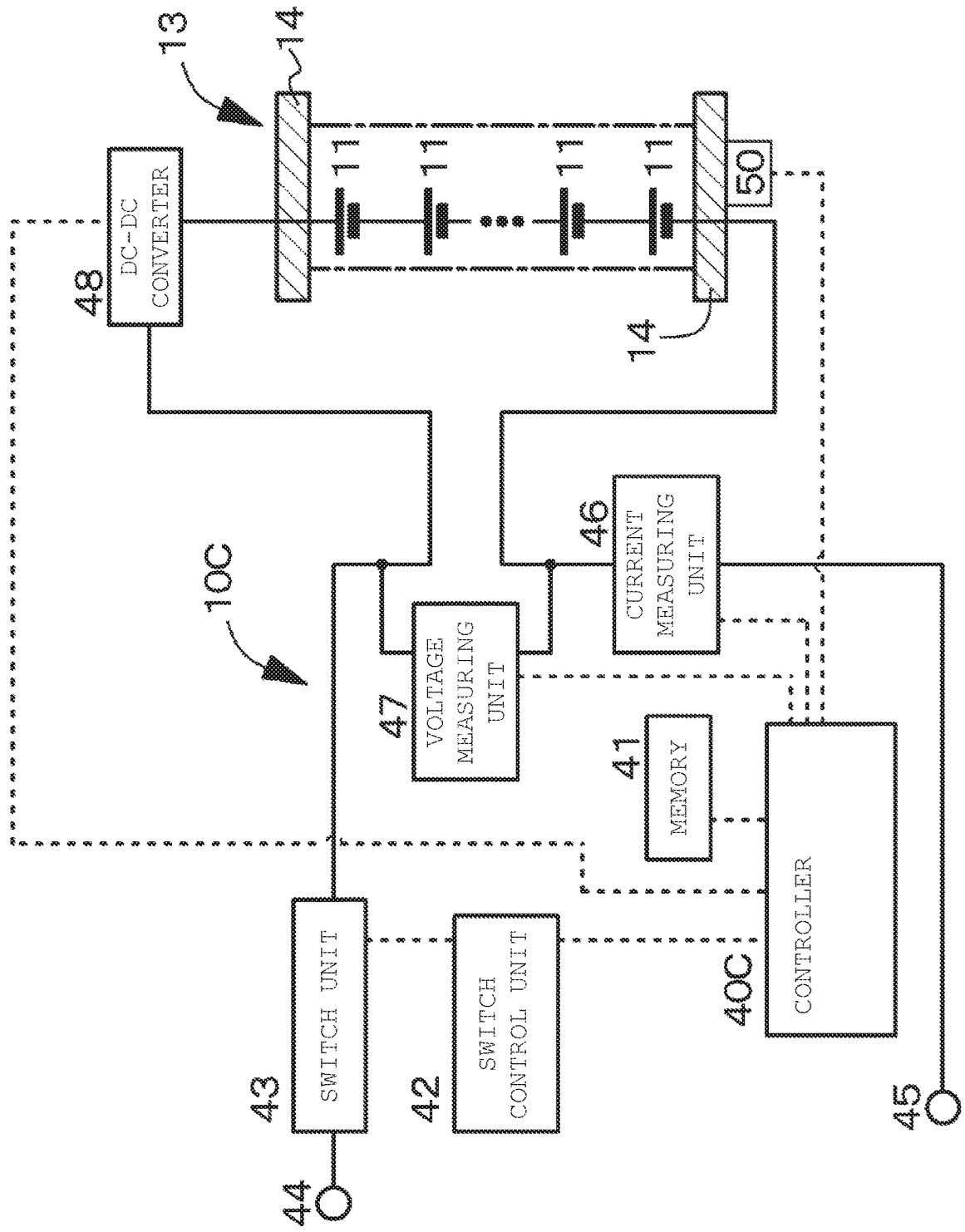
FIG. 9 is a conceptual view of a charge and discharge control device according to an embodiment of the present disclosure.
Figure 10:
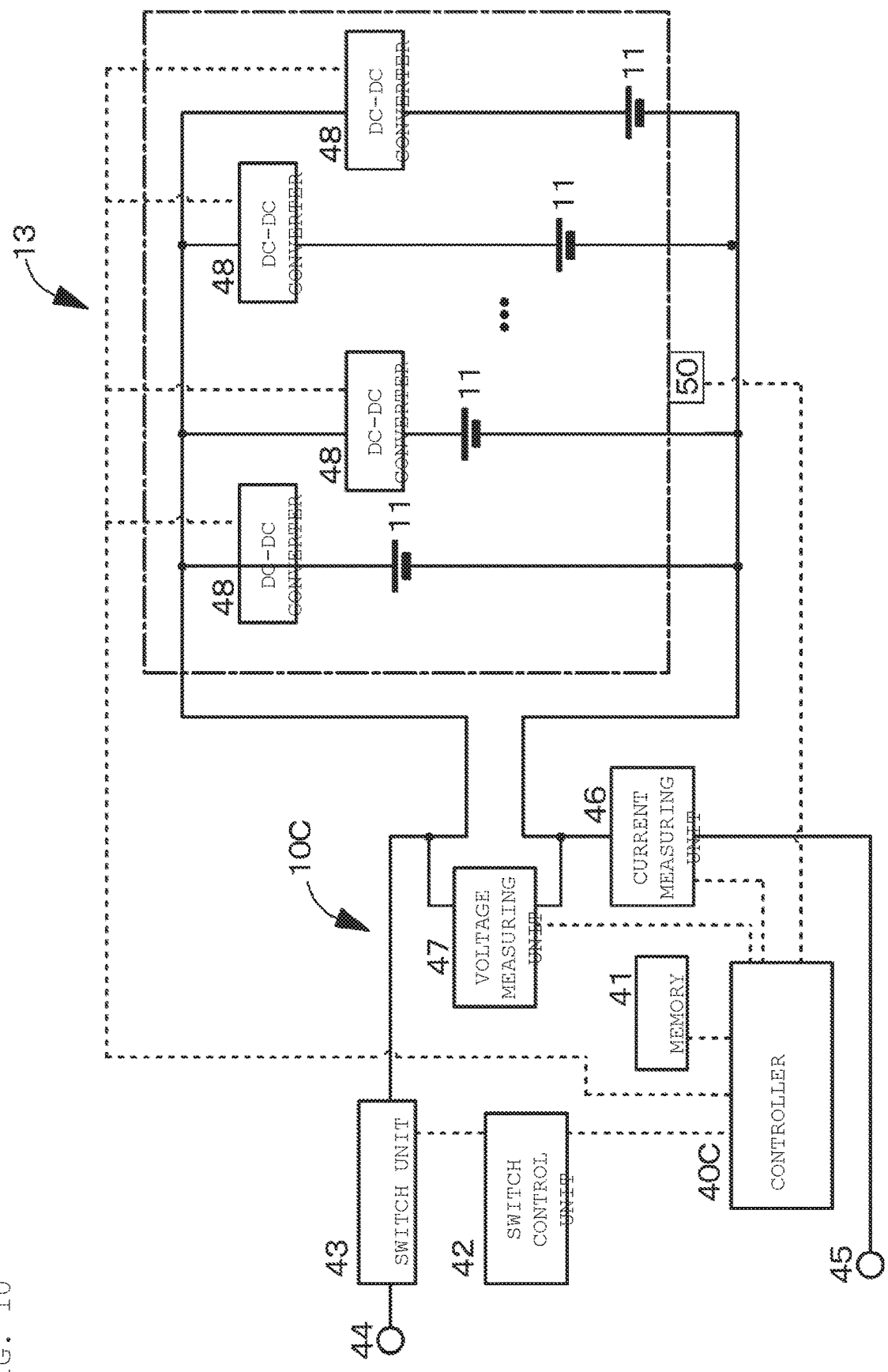
FIG. 10 is a conceptual view of a modified example of the charge and discharge control device according to an embodiment of the present disclosure.
Figure 11:
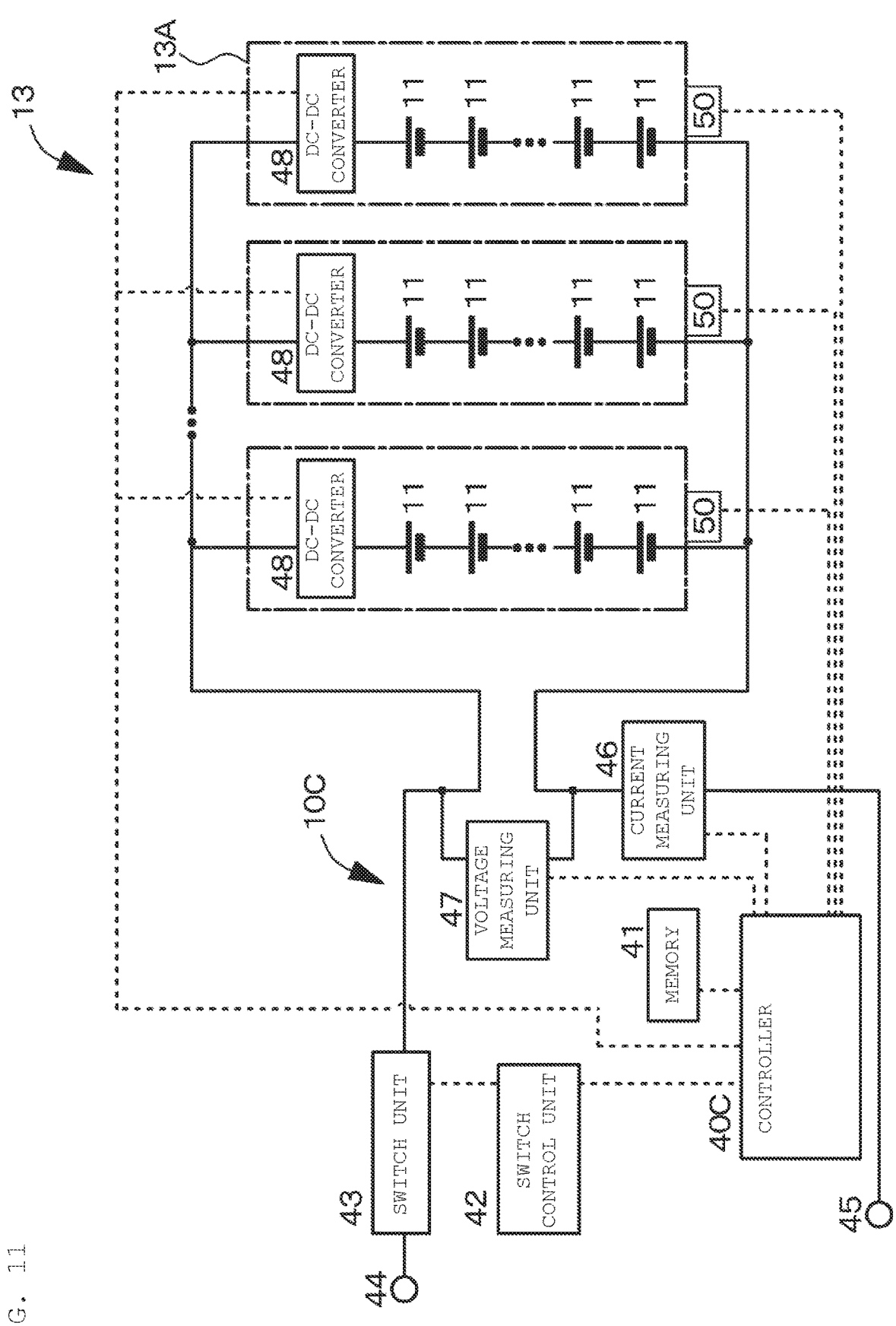
FIG. 11 is a conceptual view of another modified example of the charge and discharge control device according to an embodiment of the present disclosure.

For example, in the secondary battery pack 13 in which a plurality of secondary batteries are connected in series, as described with reference to FIG. 5, the charge and discharging current of the secondary battery pack 13 is controlled as illustrated in FIG. 9. In addition, in the secondary battery pack 13 in which the plurality of secondary batteries are connected in parallel, as described with reference to FIG. 6, the charge and discharging current of the secondary battery pack 13 is controlled as illustrated in FIG. 10. Furthermore, in the secondary battery pack 13 in which a plurality of sets of secondary batteries connected in series (series and secondary battery units 13A) are connected in parallel, as described with reference to FIG. 7, the charging and discharging current of the series and secondary battery pack 13A is controlled as illustrated in FIG. 11.

Figure 12:
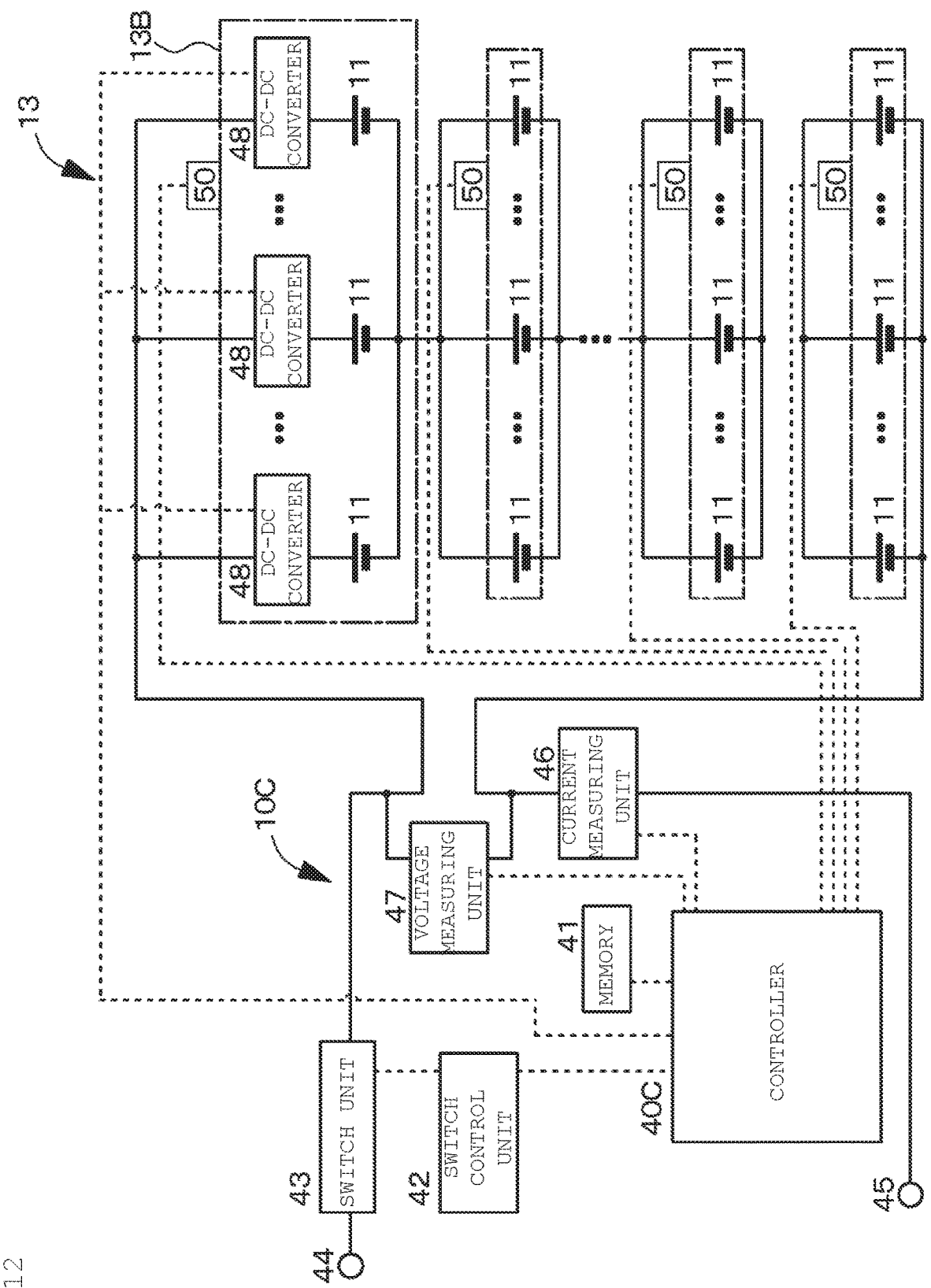
FIG. 12 is a conceptual view of still another modified example of the charge and discharge control device according to an embodiment of the present disclosure.

In addition, in the secondary battery pack 13 in which the plurality of sets of secondary batteries connected in parallel (parallel and secondary battery units 13B) are connected in series, as described with reference to FIG. 8, the charging and discharging current of the parallel and secondary battery pack 13B is controlled as illustrated in FIG. 12.

In the charge and discharge control device according to Example 3, the controller controls the charging and discharging current of each of the secondary batteries or the secondary battery pack so that the amount of displacement of the secondary battery does not exceed the predetermined threshold value, so the abnormal displacement can be reliably prevented from occurring in the secondary battery and the deterioration in the secondary battery can be reliably suppressed.

EXAMPLE 4

Example 4 relates to a method of detecting deterioration in a secondary battery according to the present disclosure. That is, a method of detecting deterioration in a secondary battery according to Example 4 is a method of detecting deterioration in a secondary battery including one or a plurality of sensors 50, and includes:

Detecting, by a sensor 50, a displacement occurring in the secondary battery 11 due to charging and discharging; and notifying that the secondary battery 11 deteriorates when an amount of displacement of the secondary battery 11 detected by the sensor 50 exceeds a prescribed value. In the method of detecting deterioration in a secondary battery according to Example 4, the charge and discharge control device described in Examples 1 to 3 can be used.

Specifically, for example, it is notified that the secondary battery 11 deteriorates when a value of ΔS in Example 1 is a prescribed value which is β times (1<β, specifically, for example, β is not limited thereto, but β=2) threshold values $Th_1$, $Th_2$, and $Th_3$ of ΔS, Then, for example, the notification may be made based on voice or a warning sound, the notification may be made based on an image display, or the notification may be made in combination thereof.

In the method of detecting deterioration in a secondary battery according to Example 4, when the amount of displacement occurring in the secondary battery due to charging and discharging is detected by the sensor, and it is notified that the secondary battery deteriorates when the amount of displacement detected by the sensor exceeds the prescribed value, so it is possible to reliably suppress the use of the deteriorating secondary battery. The method of detecting deterioration in a secondary battery according to Example 4 can be applied to Examples 1 to 4.

EXAMPLE 5

Example 5 relates to a method of detecting charging abnormality of a secondary battery according to the present disclosure. A method of detecting charging abnormality of a secondary battery according to Example 5 is a method of detecting charging abnormality of a secondary battery including one or a plurality of sensors 50, and includes:

Detecting, by a sensor 50, a displacement occurring in the secondary battery 11 due to charging and discharging; and notifying that charging and discharging abnormality occurs in the secondary battery 11 when an amount of displacement of the secondary battery 11 detected by the sensor 50 exceeds a prescribed value. In the method of detecting charging abnormality of a secondary battery according to Example 5, the charge and discharge control device described in Examples 1 to 3 can be used.

Specifically, for example, it is notified that the charging and discharging abnormality occurs in the secondary battery 11 when a value of ΔS in Example 1 exceeds a prescribed value which is γ times threshold values $Th_1$, $Th_2$, and $Th_3$ of ΔS (1<γ, specifically, for example, γ is not limited thereto, but γ=2). Then, for example, the notification may be made based on voice or a warning sound, the notification may be made based on an image display, or the notification may be made in combination thereof.

The method of detecting charging abnormality of a secondary battery according to Example 5 includes detecting, by a sensor, a displacement occurring in a secondary battery due to charging and discharging, and notifying that charging and discharging abnormality occurs in the secondary battery when the amount of displacement detected by the sensor exceeds the prescribed value, so it is possible to reliably suppress the secondary battery with the charging and discharging abnormality from being used as it is. The method of detecting charging abnormality of a secondary battery according to Example 5 can be applied to Examples 1 to 4. In addition, it is also possible to combine the method of detecting charging abnormality of a secondary battery according to Example 5 with the method of detecting deterioration in a secondary battery according to Example 4.

EXAMPLE 6

In Examples 6 and 7, specific examples of a secondary battery will be described.

Figure 13:
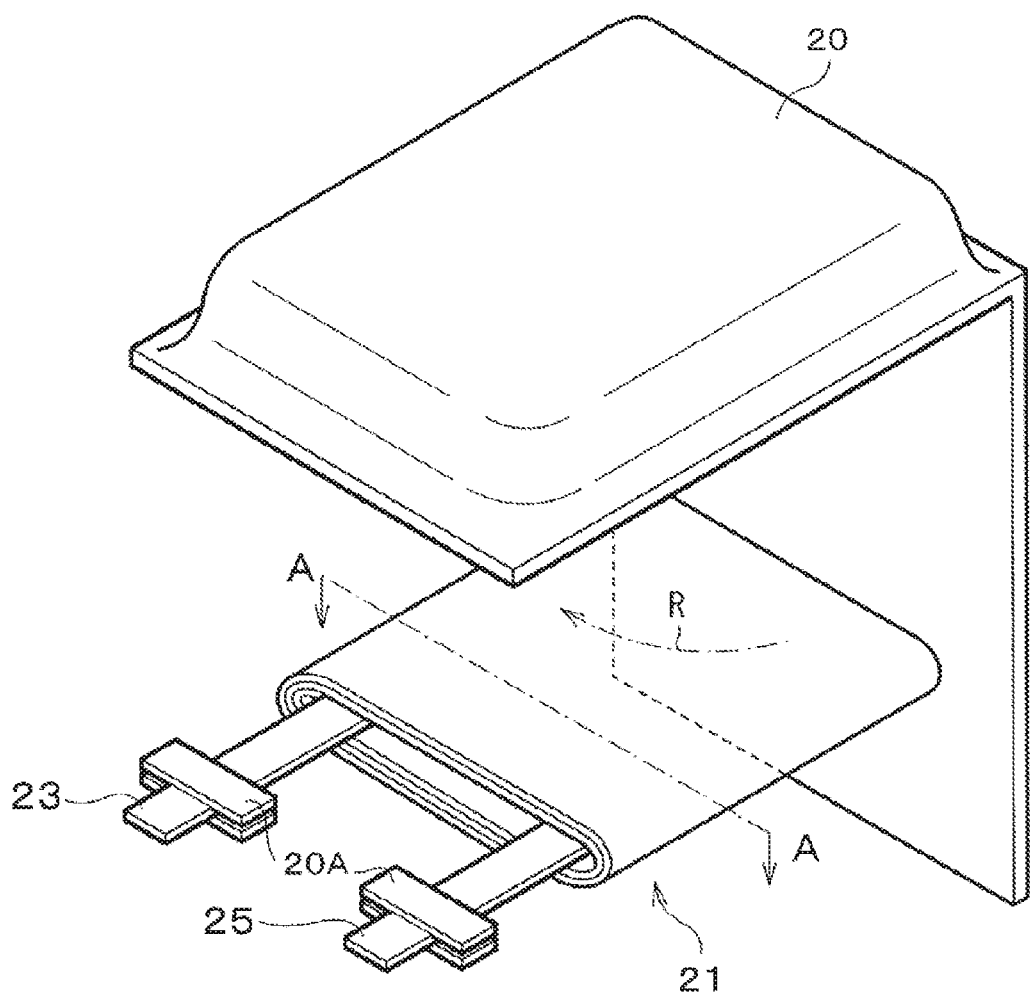
FIG. 13 is a schematic exploded perspective view of a laminated film type rectangular secondary battery (lithium ion secondary battery) according to an embodiment of the present disclosure.
Figure 14A:
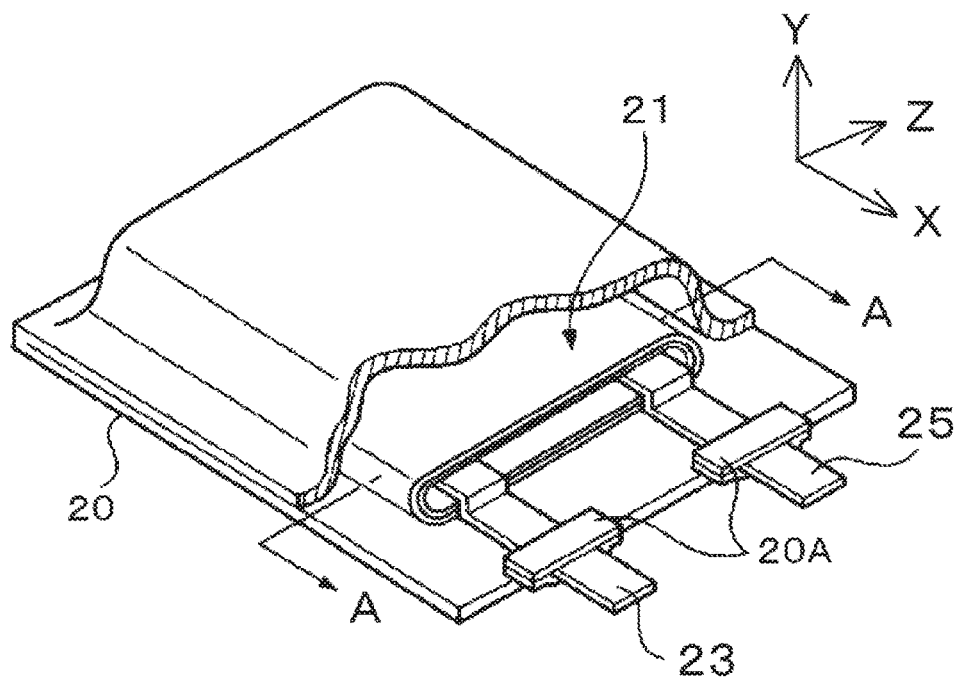
FIG. 14A is a schematic exploded perspective view of the laminated film type secondary battery (lithium ion secondary battery) according to an embodiment of the present disclosure in a state different from that illustrated in FIG. 13.
Figure 14B:
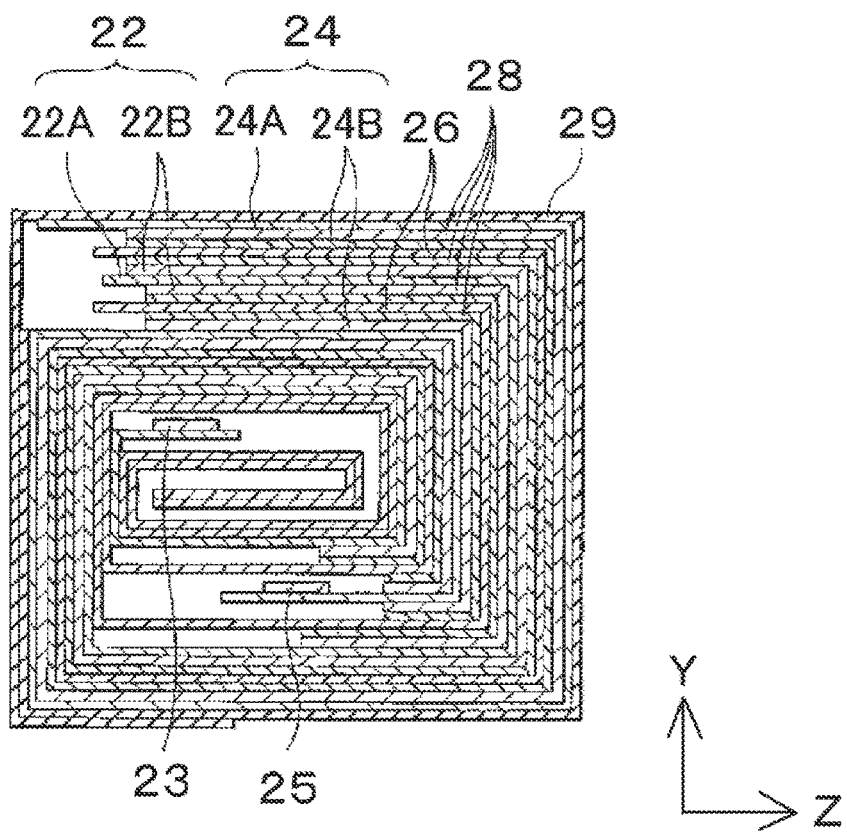
FIG. 14B is a schematic cross-sectional view of an electrode structure in the laminated film type secondary battery (lithium ion secondary battery) according to an embodiment of the present disclosure, taken along arrow A-A of FIGS. 13 and 14A.
Figure 15:
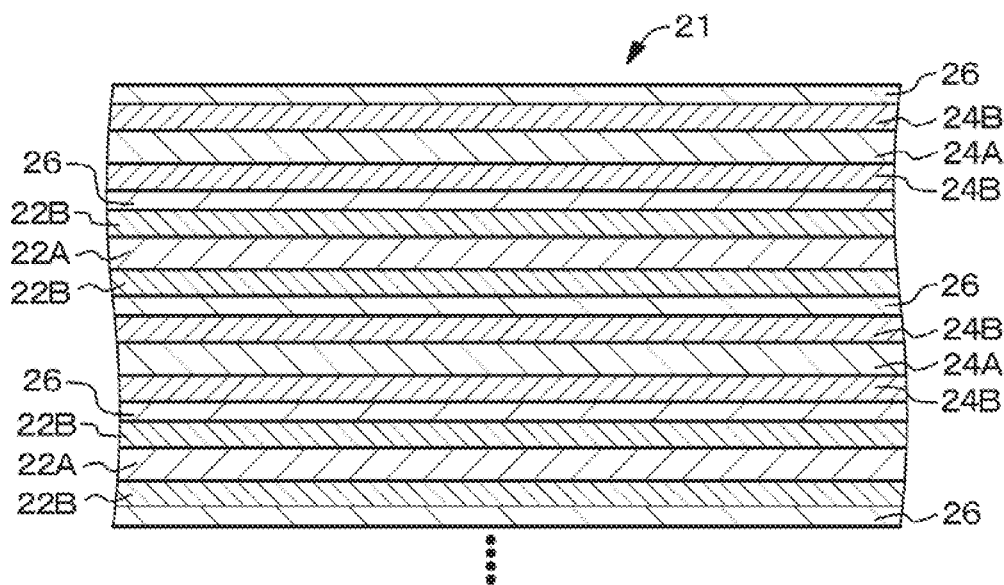
FIG. 15 is a schematic partial cross-sectional view of a wound electrode laminate in the secondary battery according to an embodiment of the present disclosure.

A secondary battery according to Example 6 is a flat laminated film type lithium ion secondary battery, in which a cathode member, a separator, and an anode member are wound. A schematic exploded perspective view of the secondary battery according to Example 6 is illustrated in FIGS. 13 and 14A, and a schematic enlarged cross-sectional view (schematic enlarged cross-sectional view taken along a YZ, plane) of an electrode structure (laminated structure) illustrated in FIG. 14A taken along the arrow A-A is illustrated in FIG. 14B. Furthermore, FIG. 15 illustrates a schematic partial cross-sectional view (schematic partial cross-sectional view taken along the XY plane) in a part of the electrode structure illustrated in FIG. 14B is enlarged and illustrates a schematic partial cross-sectional view of an electrode structure taken along a longitudinal direction. Here, FIG. 15 illustrates a schematic partial cross-sectional view of a portion in which a cathode lead portion and an anode lead portion are not disposed, in which the electrode structure is illustrated flat for simplification of the drawing, but in fact, the electrode structure is curved because it is wound.

In the secondary battery of Example 6, an electrode structure 21 is housed in an exterior member 20 formed of a laminated film. The electrode structure 21 can be produced by laminating a cathode member 22 and an anode member 24 with a separator 26 and a gel-like electrolyte layer 28 interposed therebetween and then winding the laminated structure. A cathode lead portion 23 is attached to the cathode member 22, and an anode lead portion 25 is attached to the anode member 24. An outermost peripheral portion of the electrode structure 21 is protected by a protective tape 29. For example, the sensor 50 is fixed (specifically, bonded) to an outer surface of the exterior member 20 (see FIG. 1B).

The cathode lead portion 23 and the anode lead portion 25 protrude in the same direction from the inside to the outside of the exterior member 20. The cathode lead portion 23 is made of conductive materials such as aluminum. The anode lead portion 25 is made of conductive materials such as copper, nickel, stainless steel or the like. These conductive materials are, for example, a thin plate shape or a mesh shape.

The exterior member 20 is one film foldable in a direction of the arrow R illustrated in FIG. 13, and a part of the exterior member 20 is provided with a recess (emboss) for housing the electrode structure 21. The exterior member 20 is, for example, a laminated film in which a fusion layer, a metal layer, and a surface protective layer are laminated in this order. In a process of manufacturing a lithium ion secondary battery, after the exterior member 20 is folded so that the fusion layers face each other with the electrode structure 21 interposed therebetween, outer peripheral edge portions of the fusion layers are fused to each other. However, the exterior member 20 may be one in which two laminated films are bonded to each other with an adhesive or the like interposed therebetween. The fusion layer is formed of a film made of, for example, polyethylene, polypropylene or the like. The metal layer is formed of, for example, an aluminum foil or the like. The surface protective layer is made of, for example, nylon, polyethylene terephthalate or the like. Among them, the exterior member 20 is preferably an aluminum laminated film in which a polyethylene film, an aluminum foil, and a nylon film are laminated in this order. However, the exterior member 20 may be a laminated film having another laminated structure, a polymer film of polypropylene or the like, or a metal film. Specifically, a moisture resistant aluminum laminated film (thickness of 100 μm in total) in which a nylon film (thickness of 30 μm), an aluminum foil (thickness of 40 µm), and a non-stretched polypropylene film (thickness of 30 µm) are laminated in this order from the outside is formed.

In order to prevent the intrusion of the outside air, an adhesive film 20A is inserted between the exterior member 20 and the cathode lead portion 23 and between the exterior member 20 and the anode lead portion 25. The adhesive film 20A is made of a materials such as a polyolefin resin which has adhesiveness to the cathode lead portion 23 and the anode lead portion 25, and more specifically, is made of a polyolefin resin such as polyethylene, polypropylene, modified polyethylene, or modified polypropylene.

As illustrated in FIG. 14B, the cathode member 22 has a cathode active material layer 22B on one surface or both surfaces of a cathode current collector 22A. In addition, the anode member 24 has an anode active material layer 24B on one surface or both surfaces of an anode current collector 24A.

The cathode member 22 can also be produced based on the following method. That is, first, after lithium carbonate ($Li_2CO_3$) and cobalt carbonate ($CoCO_3$) are mixed, the mixture is fired in an air atmosphere (900° C.×5 hours) to obtain a lithium-containing composite oxide ($CoO_2$). In this case, a mixing ratio is, for example, $Li_2CO_3$:$CoCO_3$ 0.5:1 in molar ratio. Then, 91 parts by mass of cathode active material ($LiCoO_2$), 3 parts by mass of the cathode binder (polyvinylidene fluoride), and 6 parts by mass of the cathode conductive agent (graphite) are mixed to obtain a cathode mixture. Then, the cathode mixture is mixed with an organic solvent (N-methyl-2-pyrrolidone) to obtain a paste-like cathode mixture slurry. Thereafter, the cathode mixture slurry is applied on both surfaces of a strip-like cathode current collector 22A (aluminum foil having a thickness of 20 µm) using a coating apparatus, and then the cathode mixture slurry is dried to form the cathode active material layer 22B. The cathode active material layer 22B is compression-molded using a roll press machine.

Alternatively, when $Li_{1.15}(Mn_{0.65}Ni_{0.22}Co_{0.13})_{0.85}O_2$ is used as the cathode active material, first, nickel sulfate ($NiSO_4$), cobalt sulfate ($CoSO_4$), and manganese sulfate ($MnSO_4$) are mixed. Then, the mixture was dispersed in water to prepare an aqueous solution. Next, sodium hydroxide (NaOH) was added to an aqueous solution while the aqueous solution is sufficiently stirred to obtain a coprecipitate (manganese-nickel-cobalt composite coprecipitated hydroxide). Thereafter, the coprecipitate was washed with water and dried, and then was added with lithium hydroxide monohydrate to obtain a precursor. The above-mentioned cathode active material can be obtained by firing the precursor (800° C.×10 hours) in an air atmosphere.

Alternatively, when $LiNi_{0.5}Mn_{1.50}O_4$ is used as the cathode active material, first, lithium carbonate ($Li_2CO_3$), manganese oxide ($MnO_2$), and nickel oxide (NiO) are weighed, and the weighed product is mixed by a ball mill. In this case, a mixing ratio (molar ratio) of the main elements was set to Ni:Mn=25:75. Next, the mixture was fired in an air atmosphere (800° C.×10 hours) and then cooled. Next, the fired product is remixed by the ball mill, and then the fired product is fired again in an air atmosphere (700° C.×10 hours) to obtain the cathode active material.

When the anode member 24 is produced, first, 97 parts by mass of anode active material (graphite or a mixed material of graphite and silicon) and 3 parts by mass of the anode binder (polyvinylidene fluoride) are mixed to obtain an anode mixture. An average particle diameter $d_{50}$ of graphite is set to 20 µm. Next, the anode mixture is mixed with an organic solvent (N-methyl-2-pyrrolidone) to obtain a paste-like anode mixture slurry. The anode mixture slurry is applied on both surfaces of the strip-like anode current collector 24A (aluminum foil having a thickness of 20 µm) using the coating apparatus, and then the anode mixture slurry is dried to form the anode active material layer 24B. The anode active material layer 24B is compression-molded using the roll press machine.

Alternatively, the anode active material (silicon) and the precursor (polyamic acid) of the anode binder can be mixed to form the anode mixture. In this case, the mixing ratio is set to silicon:polyamic acid=80:20 in dry mass ratio. An average particle diameter $d_{50}$ of silicon is set to 1 µm. As the solvent for the polyamic acid, N-methyl-2-pyrrolidone and N,N-dimethylacetamide are used. In addition, after the compression molding, the anode mixture slurry is heated in the vacuum atmosphere under conditions such as 100° C.×12 hours. Thus, polyimide, which is the anode binder, is formed.

The separator 26 is made of, for example, a microporous polypropylene film having a thickness of 26 µm.

The gel-like electrolyte layer 28 contains a non-aqueous electrolytic solution and a polymer compound for holding, and the non-aqueous electrolytic solution is configured to be held by the polymer compound for holding. While such a gel-like electrolyte layer 28 obtains high ion conductivity (for example, 1 mS/cm or more at room temperature), the liquid leakage of the non-aqueous electrolytic solution is prevented. The gel-like electrolyte layer 28 may further contain other materials such as an additive.

Examples of compositions of the non-aqueous electrolytic solution can be shown in Table 1 below.

TABLE 1

Organic solvent: EC/PC at mass ratio of 1/1
Lithium salt forming non-aqueous electrolytic solution: $LiPFe_6$
1.0 mol/liter
Other additives: 1% by mass of vinylene carbonate (VC)

In the gel-like electrolyte layer 28, the solvent of the non-aqueous electrolytic solution is a broad concept including not only liquid materials but also materials having ion conductivity capable of dissociating an electrolyte salt. Therefore, in the case of using a polymer compound having ion conductivity, the polymer compound is also included in the solvent. Instead of the gel-like electrolyte layer 28, the non-aqueous electrolytic solution may be used as it is. In this case, the non-aqueous electrolytic solution is impregnated into the electrode structure 21.

Specifically, in the case of forming the gel-like electrolyte layer 28, first, the non-aqueous electrolytic solution is prepared. The non-aqueous electrolytic solution, the polymer compound for holding, and the organic solvent (dimethyl carbonate) are mixed to prepare a sol-like precursor solution. As the polymer compound for holding, a copolymer (the amount of copolymerization of hexafluoropropylene=6.9% by mass) of hexafluoropropylene and vinylidene fluoride is used. Next, after the precursor solution is applied to the cathode member 22 and the anode member 24, the precursor solution is dried to form the gel-like electrolyte layer 28.

The lithium ion secondary battery including the gel-like electrolyte layer can be manufactured, for example, based on the following three types of procedures.

In the first procedure, first, the cathode active material layer 22B is formed on both surfaces of the cathode current collector 22A, and the anode active material layer 24B is formed on both surfaces of the anode current collector 24A.

On the other hand, the non-aqueous electrolytic solution, the polymer compound for holding, and the organic solvent are mixed to prepare the sol-like precursor solution. After the precursor solution is applied to the cathode member 22 and the anode member 24, the precursor solution is dried to form the gel-like electrolyte layer 28. Thereafter, the cathode lead portion 23 is attached to the cathode current collector 22A using a welding method or the like, and the anode lead portion 25 is attached to the anode current collector 24A. Next, the cathode member 22 and the anode member 24 are laminated with the separator 26 interposed therebetween, the separator 26 being formed of a microporous polypropylene film having a thickness of 26 μm, and are wound to produce the electrode structure 21 and then the protective tape 29 is bonded to the outermost peripheral portion of the electrode structure 21. Thereafter, after the exterior member 20 is folded so as to sandwich the electrode structure 21, the outer peripheral portions of the exterior member 20 are bonded to each other using a heat fusion method to encapsulate the electrode structure 21 into the exterior member 20. The adhesive film (acid-modified propylene film having a thickness of 50 μm) (not illustrated) is inserted between the cathode lead portion 23 and the anode lead portion 25 and the exterior member 20.

Alternatively, in the second procedure, first, the cathode member 22 and the anode member 24 are produced. The cathode lead portion 23 is attached to the cathode member 22, and the anode lead portion 25 is attached to the anode member 24. Thereafter, the cathode member 22 and the anode member 24 are laminated with the separator 26 interposed therebetween and wound to produce a wound body which is the precursor of the electrode structure 21, and then the protective tape 29 is bonded to the outermost peripheral portion of the wound body. Next, after the exterior member 20 is folded so as to sandwich the wound body, the remaining outer peripheral edge portion excluding the outer peripheral edge portion of one side in the exterior member 20 is bonded using a heat fusion method or the like, and the wound body is housed inside the bag-like exterior member 20. On the other hand, a composition for electrolyte is prepared by mixing the non-aqueous electrolytic solution, a monomer which is a raw material of a polymer compound, a polymerization initiator, and if necessary, other materials such as a polymerization inhibitor. After the composition for electrolyte is injected into the inside of the bag-like exterior member 20, the exterior member 20 is sealed using the heat fusion method or the like. Thereafter, the monomer is thermally polymerized to form a polymeric compound. Thereby, the gel-like electrolyte layer 28 is formed.

Alternatively, in the third procedure, the wound body is produced in the same manner as the second procedure except for using the separator 26 with the polymer compound applied on both surfaces thereof and is housed in the bag-like exterior member 20. Examples of the polymer compound applied to the separator 26 includes a polymer (homopolymer, copolymer, or multi-component copolymer) containing vinylidene fluoride as a component. Specifically, examples of the polymer compound include a binary copolymer containing polyvinylidene fluoride, vinylidene fluoride, and hexafluoropropylene as a component, a ternary copolymer containing vinylidene fluoride, hexafluoropropylene, and chlorotrifluoroethylene as a component or the like. One or two or more other polymer compounds may be used together with the polymer containing vinylidene fluoride as a component. Thereafter, the non-aqueous electrolytic solution is prepared and injected into the inside of the exterior member 20, and then the opening of the exterior member 20 is sealed by the heat fusion method or the like. Next, the exterior member 20 is heated while being applied with a load to make the separator 26 adhere to the cathode member 22 and the anode electrode member 24 with the polymer compound interposed therebetween. As a result, the non-aqueous electrolytic solution is impregnated into the polymer compound, and the polymer compound is gelated to form the gel-like electrolyte layer 28.

In the third procedure, the swelling of the lithium ion secondary battery is suppressed more than in the first procedure. In addition, compared to the second procedure, in the third procedure, the solvent, the monomer which is a raw material of the polymer compound and the like hardly remain in the gel-like electrolyte layer 28, so the step of forming the polymer compound is favorably controlled. Therefore, the cathode member 22, the anode member 24, and the separator 26 sufficiently adhere to the gel-like electrolyte layer 28.

EXAMPLE 7

Figure 16:
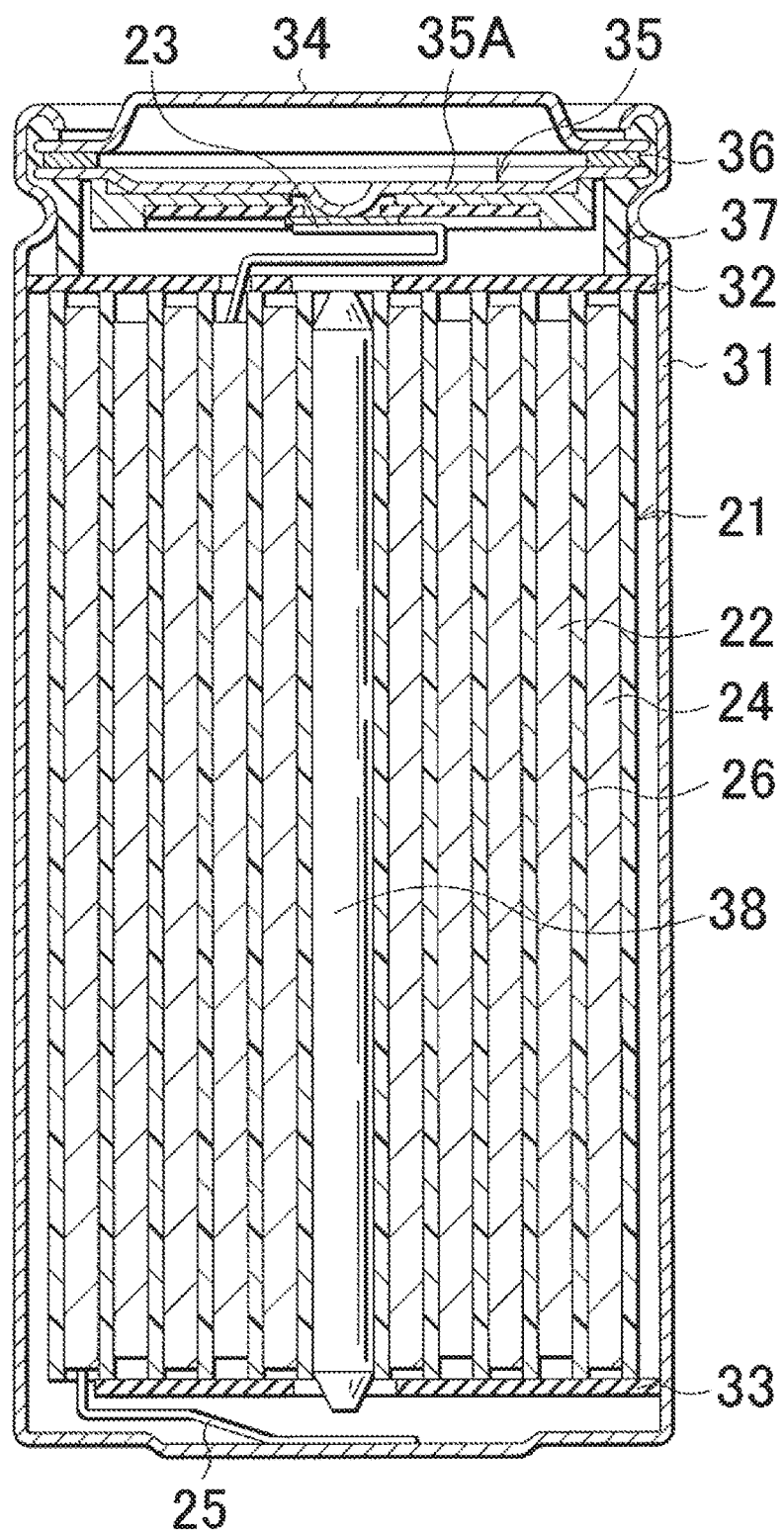
FIG. 16 is a schematic cross-sectional view of a secondary battery according to an embodiment of the present disclosure.

A secondary battery according to Example 7 is a cylindrical lithium ion secondary battery. A schematic cross-sectional view of the cylindrical secondary battery (lithium ion secondary battery) according to Example 7 is illustrated in FIG. 16.

In the secondary battery according to Example 7, an electrode structure 21 and a pair of insulating plates 32 and 33 are housed in a substantially hollow cylindrical electrode structure housing member 31. The electrode structure 21 can be produced, for example, by laminating a cathode member 22 and an anode member 24 with a separator 26 interposed therebetween to obtain an electrode structure, and then winding the electrode structure.

The electrode structure housing member (battery can) 31 has a hollow structure in which one end portion is closed and the other end portion is opened, and is made of iron (Fe), aluminum (Al) or the like. A surface of the electrode structure housing member 31 may be plated with nickel (Ni) or the like. The pair of insulating plates 32 and 33 has the electrode structure 21 interposed therebetween and are disposed to extend perpendicularly to a winding peripheral surface of the electrode structure 21. An open end portion of the electrode structure housing member 31 is caulked with a battery lid 34, a safety valve mechanism 35, and a thermal sensitive resistance element (positive temperature coefficient element (PTC element)) 36 via a gasket 37, so the electrode structure housing member 31 is sealed. The battery lid 34 is made of, for example, the same material as the electrode structure housing member 31. The safety valve mechanism 35 and the thermal resistance element 36 are provided inside the battery lid 34, and the safety valve mechanism 35 is electrically connected to the battery lid 34 with the thermal sensitive resistance element 36 interposed therebetween. In the safety valve mechanism 35, a disc plate 35A is reversed when the internal pressure becomes a certain level or more due to an internal short circuit, external heating, and the like. As a result, an electrical connection between the battery lid 34 and the electrode structure 21 is disconnected. In order to prevent abnormal heat generation caused by a large current, the resistance of the heat sensitive resistance element 36 increases as the temperature rises. The gasket 37 is made of, for example, an insulating material. A surface of the gasket 37 is applied with asphalt and the like. For example, a sensor 50 is fixed (specifically, bonded) to an outer surface (more specifically, a side surface of the electrode structure housing member (battery can) 31) of the electrode structure housing member (battery can) 31, but the sensor 50 is not illustrated.

A center pin 38 is inserted into a winding center of the electrode structure 21. However, the center pin 38 may not be inserted into the winding center. A cathode lead portion 23 made of a conductive material such as aluminum is connected to the cathode member 22. Specifically, the cathode lead portion 23 is attached to a cathode current collector 22A. An anode lead portion 25 made of a conductive material such as copper is connected to the anode member 24. Specifically, the anode lead portion 25 is attached to a anode current collector 24A. The anode lead portion 25 is welded to the electrode structure housing member 31 and is electrically connected to the electrode structure housing member 31. The cathode lead portion 23 is welded to the safety valve mechanism 35 and is electrically connected to the battery lid 34. In the example illustrated in FIG. 16, the anode lead portion 25 is provided at one place (an outermost peripheral portion of the wound electrode structure), but may be provided at two places (an outermost peripheral portion and an innermost peripheral portion of the wound electrode structure).

The electrode structure 21 is formed by laminating the cathode member 22 formed with a cathode active material layer 22B on the cathode current collector 22A (specifically, on both surfaces of the cathode current collector 22A) and the anode member 24 formed with an anode active material layer 24B on the anode current collector 24A (specifically, both surfaces of the anode current collector 24A) with a separator 26 interposed therebetween. The cathode active material layer 22B is not formed in a region of the cathode current collector 22A to which the cathode lead portion 23 is attached, and the anode active material layer 24B is not formed in a region of the anode current collector 24A to which the anode lead portion 25 is attached.

The specifications of the secondary battery according to Example 7 are shown in Table 2 below.

TABLE 2

| | |
|---|---|
| Cathode current collector 22A | Aluminum foil having a thickness of 20 μm |
| Cathode active material layer 22B | A thickness of 50 μm per surface |
| Cathode lead portion 23 | Aluminum (Al) foil having a thickness of 100 μm |
| Anode current collector 24A | Copper foil having a thickness of 20 μm |
| Anode active material layer 24B | A thickness of 50 μm per surface |
| Anode lead portion 25 | Nickel (Ni) foil having a thickness of 100 μm |

The secondary battery can be manufactured, for example, based on the following procedure.

That is, first, the laminated structure 21 is manufactured in the same manner as described in Example 6. The center pin 38 is inserted into a center of the electrode structure 21. Next, the electrode structure 21 is housed inside the electrode structure housing member (battery can) 31 while being interposed between the pair of insulating plates 32 and 33. In this case, by using a welding method or the like, a tip portion of the cathode lead portion 23 is attached to the safety valve mechanism 35 and a tip portion of the anode lead portion 25 is attached to the electrode structure housing member 31. Thereafter, an open end portion of the electrode structure housing member 31 is caulked with the battery lid 34, the safety valve mechanism 35, and the heat sensitive resistance element 36 via the gasket 37.

EXAMPLE 8

In Example 8, an application example of a charge and discharge control device according to the present disclosure will be described.

The method of charging and discharging a secondary battery, the method of detecting deterioration in a secondary battery, and the method of detecting charging abnormality of a secondary battery according to the present disclosure described in Examples 1 to 5, and the charge and discharge control device according to the first to third aspects of the present disclosure can be applied to a machine, a device, equipment, an apparatus, a system (a set of a plurality of devices and the like) which can be used as a power supply for driving and operating a secondary battery or a power storage source for power storage without particular limitation. The secondary battery (specifically, for example, the lithium ion secondary battery described in Examples 6 and 7) may be a main power supply (preferentially used power supply) or an auxiliary power supply (power supply used instead of the main power supply or switched from the main power supply). When a lithium ion secondary battery is used as the auxiliary power supply, the main power supply is not limited to the lithium ion secondary battery.

Specific applications of the secondary battery (specifically, lithium ion secondary battery) according to the present disclosure can include of a video camera, a camcorder, a digital still camera, a mobile phone, a personal computer, a television receiver, various display devices, a cordless phone, a headphone stereo, a music player, a portable radio, electronic papers such as an electronic book and an electronic newspaper, various electronic devices such as a portable information terminal including a PDA, and electric devices (including a portable electronic device); a toy; portable household appliances such as electric shaver; a lighting device including a room light and the like; medical electronic devices such as a pacemaker and a hearing aid; memory devices such as a memory card; a secondary battery pack used for a personal computer and the like as a removable power supply; electric tools such as an electric drill and an electric saw; a power storage system such as a home battery system for storing power in preparation for an emergency or the like, a home energy server (home power storage device), and power supply system; a storage unit or a backup power supply; electric motor vehicles such as an electric vehicle, an electric motorcycle, an electric bicycle, and Segway (registered trademark); and a power driving force conversion device for an aircraft or a ship (specifically, for example, a power motor), but are not limited thereto.

Among them, the secondary battery (specifically, lithium ion secondary battery) according to the present disclosure is effectively applied to a secondary battery pack, an electric motor vehicle, a power storage system, a power supply system, an electric tool, an electronic device, an electric device, and the like. Since excellent battery characteristics are required, it is possible to effectively improve the performance by applying the present disclosure. The secondary battery pack includes a lithium ion secondary battery, and is a so-called assembled battery. The electric motor vehicle is a vehicle which operates (travels) using the lithium ion secondary battery as a driving power supply, and may be an automobile (hybrid vehicle and the like) equipped with a driving source other than the secondary battery. The power storage system (power supply system) is a system using the lithium ion secondary battery as a power storage source. For example, in a household power storage system (power supply system), since power is stored in the lithium ion secondary battery, which is the power storage source, home electric appliances and the like can be used using power. The electric tool is a tool in which a movable portion (for example, a drill or the like) moves using the lithium ion secondary battery as a driving power supply. The electronic device or the electric device is a device which exhibits various functions as a power supply (power supply source) for operating the lithium ion secondary battery.

Hereinafter, some application examples of the lithium ion secondary battery will be specifically described. A configuration of each application described below is merely an example, and the configuration can be changed as appropriate.

The secondary battery pack is a simple secondary battery pack (so-called soft pack) using one lithium ion secondary battery, and is mounted, for example, on an electronic device represented by a smartphone. Alternatively, the secondary battery pack has an assembled battery which includes six lithium ion secondary batteries connected in two parallel and three series. The connection mode of the lithium ion secondary battery may be in series, in parallel, or a combination thereof.

Figure 17:
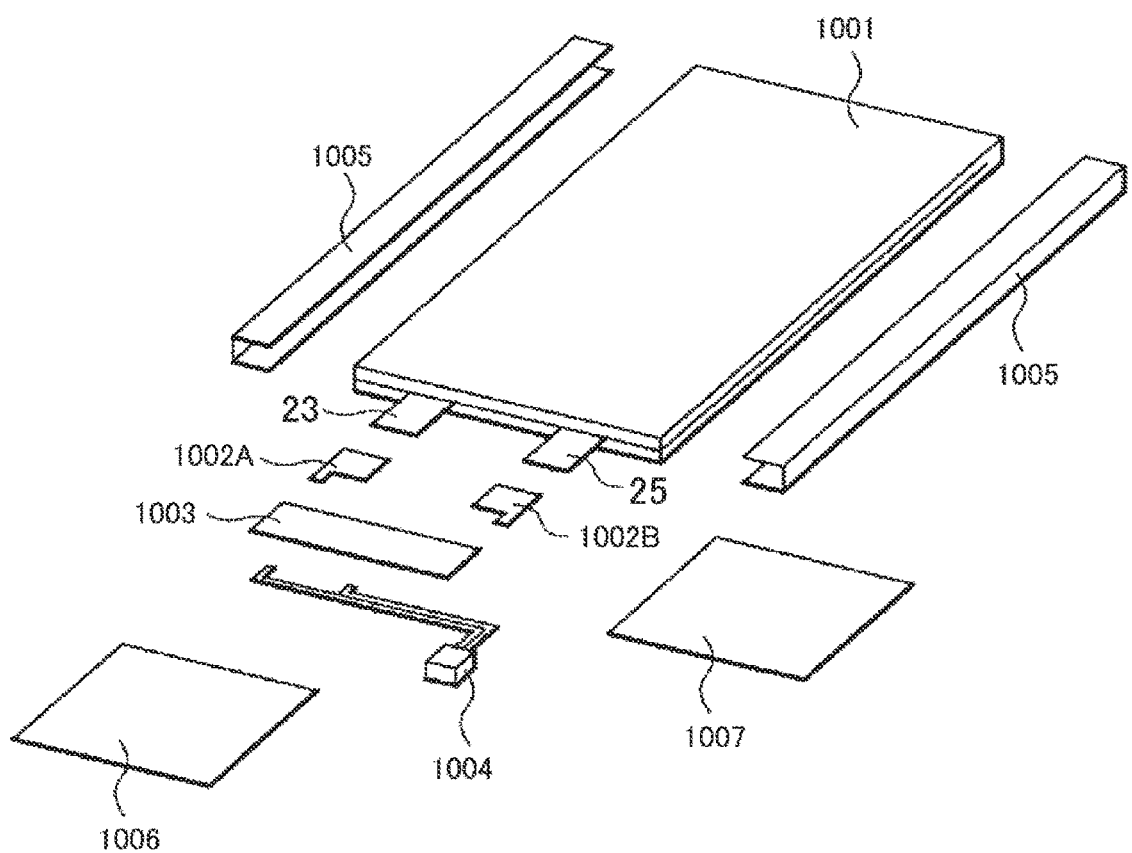
FIG. 17 is a schematic exploded perspective view of an application example secondary battery pack: unit cell) according to an embodiment of the present disclosure.

A schematic perspective view of a disassembled secondary battery pack using single cells is illustrated in FIG. 17. The secondary battery pack is a simple secondary battery pack (so-called soft pack) using one lithium ion secondary battery, and is mounted, for example, on an electronic device represented by a smartphone. The secondary battery pack includes a power supply 1001 including the charge and discharge control device described in Examples 1 to 5, and a circuit board 1003 connected to the power supply 1001. A cathode lead portion 23 and an anode lead portion 25 are attached to the power supply 1001.

A pair of adhesive tapes 1005 is attached to both sides of the power supply 1001. The circuit board 1003 is provided with a protection circuit module (PCM). The circuit board 1003 is connected to the cathode lead portion 23 via a tab 1002A, and is connected to the anode lead portion 25 with a tab 1002B. Further, a lead wire 1004 with a connector for external connection is connected to the circuit board 1003. When the circuit board 1003 is connected to the power supply 1001, the circuit board 1003 is protected from above and below by a label 1006 and an insulating sheet 1007. By attaching the label 1006, the circuit board 1003 and the insulating sheet 1007 are fixed. The charge and discharge control device described in Examples 1 to 5 is mounted on the circuit board 1003.

Figure 18A:
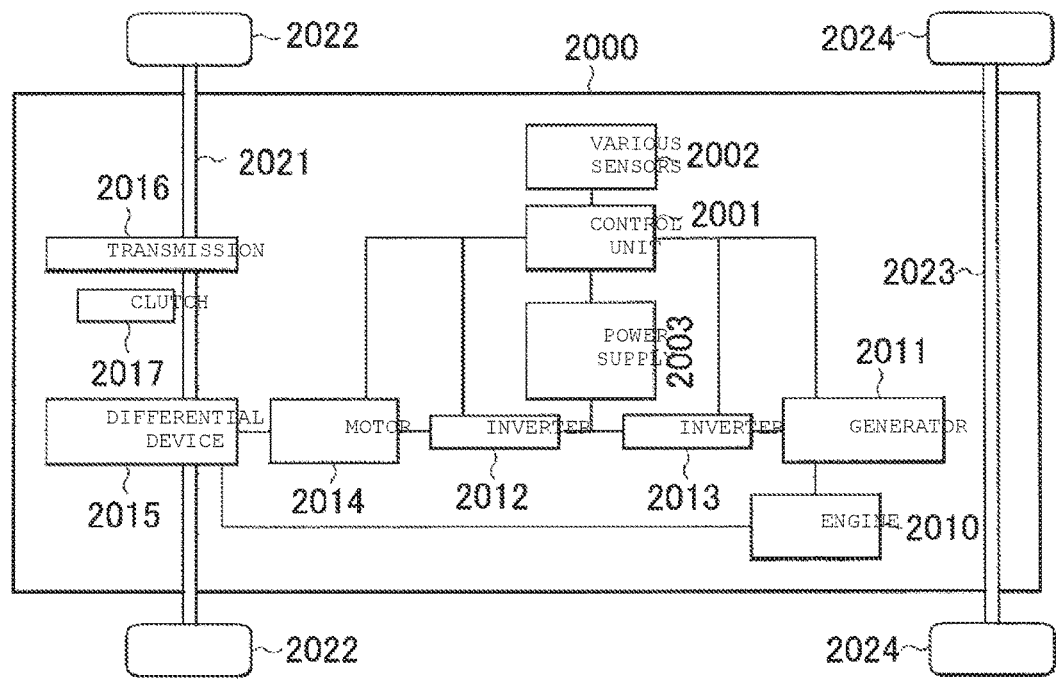
FIGS. 18A, 18B, and 18C each are a block diagram illustrating a configuration of an application example (electric motor vehicle) according to an embodiment of the present disclosure, a block diagram illustrating a configuration of an application example (power storage system) according to an embodiment of the present disclosure, and a block diagram illustrating a configuration of an application example (electric tool) according to an embodiment of the present disclosure.

FIG. 18A is a block diagram illustrating a configuration of an electric motor vehicle such as a hybrid vehicle which is an example of the electric motor vehicle. The electric motor vehicle includes a control unit 2001, various sensors 2002, a power supply 2003, an engine 2010, a generator 2011, inverters 2012 and 2013, a driving motor 2014, a differential gear 2015, a transmission 2016, and a clutch 2017 which are provided inside a metal casing 2000, for example. In addition, the electric motor vehicle includes, for example, a front wheel drive shaft 2021, a front wheel 2022, a rear wheel drive shaft 2023, and a rear wheel 2024 which are connected to the differential device 2015 or the transmission 2016.

The electric motor vehicle can travel, for example, using either the engine 2010 or the motor 2014 as a driving source. The engine 2010 is a main power source, and is, for example, a gasoline engine and the like. When the engine 2010 is used as a power source, a driving force (torque) of the engine 2010 is transmitted to the front wheel 2022 or the rear wheel 2024 via, for example, the differential device 2015, the transmission 2016, and the clutch 2017 which are a driving unit. The torque of the engine 2010 is also transmitted to the generator 2011, and the generator 2011 generates alternating current power using the torque, and the alternating current power (AC power) is converted into direct current power (DC power) via the inverter 2013 and stored in the power supply 2003. On the other hand, when the motor 2014 which is a conversion unit is used as a power source, power (DC power) supplied from the power source 2003 is converted into AC power via the inverter 12, and the AC power is used to drive the motor 2014. The driving force (torque) converted from power by the motor 2014 is transmitted to the front wheel 2022 or the rear wheel 2024 via the differential device 2015, the transmission 2016, and the clutch 2017 which are a driving unit.

When the electric motor vehicle decelerates via a braking mechanism (not illustrated), a resistance force during the deceleration is transmitted to the motor 2014 as a torque, and the torque may be used to cause the motor 2014 to generate AC power. The AC power is converted into DC power via the inverter 2012, and DC regenerative power is stored in power supply 2003.

The control unit 2001 controls the entire operation of the electric motor vehicle, and includes, for example, a CPU and the like, and the charge and discharge control device described in Examples 1 to 5. The power supply 2003 includes, for example, one or two or more lithium ion secondary batteries (not illustrated) described in Examples 6 and 7. The power supply 2003 may be connected to an external power supply, and may be configured to store power by receiving the supply of power from the external power supply. The various sensors 2002 are used, for example, to control a rotational speed of the engine 2010 and to control an opening degree (throttle opening degree) of a throttle valve (not illustrated). Examples of the sensors 2002 include a speed sensor, an acceleration sensor, an engine rotational speed sensor, and the like.

Although the case where the electric motor vehicle is a hybrid vehicle has been described, the electric motor vehicle may be a vehicle (electric vehicle) that operates using only the power supply 2003 and the motor 2014 without using the engine 2010.

Figure 18B:
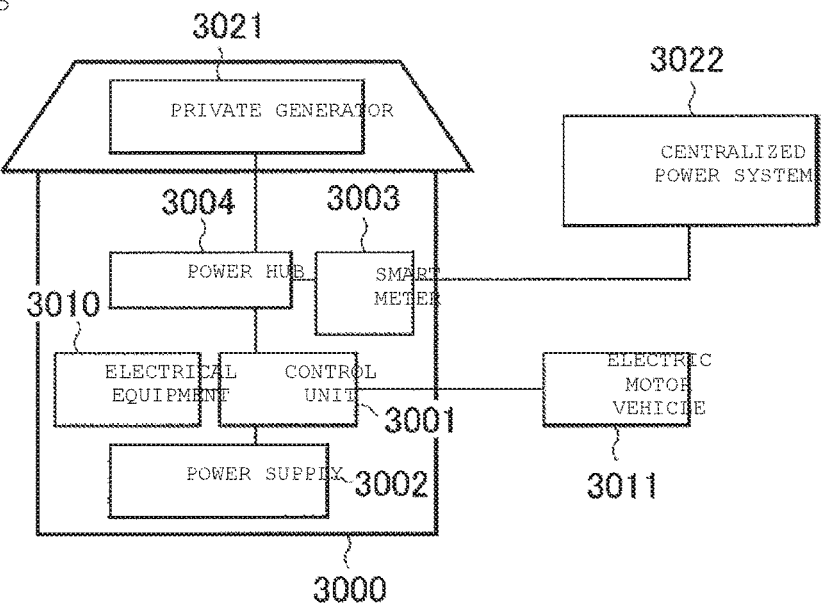

Next, FIG. 18B is a block diagram illustrating the configuration of the power storage system (power supply system). The power storage system includes, for example, a control unit 3001, a power supply 3002, a smart meter 3003, and a power hub 3004 which are installed inside a house 3000 such as a general home or a commercial building.

The power supply 3002 is connected to, for example, an electric device (electronic device) 3010 installed inside the house 3000, and can be connected to an electric motor vehicle 3011 stopped outside the house 3000. In addition, the power supply 3002 is connected to, for example, a private generator 3021 installed in the house 3000 via the power hub 3004, and can be connected to an external centralized power system 3022 via the smart meter 3003 and the power hub 3004. The electric device (electronic device) 3010 includes, for example, one or two or more home appliances. Examples of the household appliance can include a refrigerator, an air conditioner, a television receiver, a water heater and the like. The private generator 3021 is configured of, for example, a solar power generator, a wind power generator, or the like. Examples of the motor-driven vehicle 3011 include an electric vehicle, a hybrid car, an electric motorcycle, an electric bicycle, Segway (registered trademark), and the like. Examples of the centralized power system 3022 can include a commercial power source, a power generation device, a power transmission network, a smart grid (next generation power transmission network), also include a thermal power plant, a nuclear power plant, a hydroelectric power plant, a wind power plant, and the like, and examples of a power generation device provided in the centralized power system 3022 can include various solar cells, a fuel cell, a wind power generator, a micro-hydro power generator, a geothermal power generator and the like, but are not limited thereto.

The control unit 3001 controls the entire operation of the power storage system (including the use state of the power supply 3002), and includes, for example, a CPU and the like, and the charge and discharge control device described in Examples 1 to 5. The power supply 3002 includes, for example, one or two or more lithium ion secondary batteries (not illustrated) described in Examples 6 and 7. The smart meter 3003 is, for example, a network compatible power meter installed in the house 3000 which is a power demand side, and can communicate with the power supply side. The smart meter 3003 can efficiently and stably supply energy by controlling a balance of supply and demand in the house 3000 while communicating with the outside, for example.

In this power storage system, for example, power is stored in the power supply 3002 from the centralized power system 3022, which is an external power supply, via the smart meter 3003 and the power hub 3004, and is stored in the power supply 3002 from the private generator 3021, which is an independent power supply, via the power hub 3004. The power stored in the power supply 3002 is supplied to the electric device (electronic device) 3010 and the electric motor vehicle 3011 according to the instruction of the control unit 3001, so the electric device (electronic device) 3010 can be operated and the electric motor vehicle 3011 can be charged. That is, the power storage system is a system that can store and supply power in and to the house 3000 using the power supply 3002.

The power stored in the power supply 3002 is optionally available. Therefore, for example, power can be stored in the power supply 3002 from the centralized power system 3022 at midnight when an electricity charge is inexpensive, and the power stored in the power supply 3002 can be used during the day when an electricity charge is expensive.

The power storage system described above may be installed for each house (one household), or may be installed for plural houses (plural households).

Figure 18C:
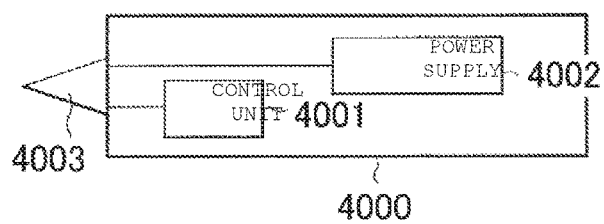

Next, FIG. 18C is a block diagram illustrating the configuration of the electric tool. The electric tool is, for example, a power drill, and includes a control unit 4001 and a power supply 4002 which is provided inside a tool main body 4000 made of a plastic material or the like. For example, a drill portion 4003 which is a movable portion is rotatably attached to the tool main body 4000. The control unit 4001 controls the entire operation of the electric tool (including the use state of the power supply 4002), and includes, for example, a CPU and the like, and the charge and discharge control device described in Examples 1 to 5. The power supply 4002 includes, for example, one or two or more lithium ion secondary batteries (not illustrated) described in Examples 6 and 7. The control unit 4001 supplies power from the power supply 4002 to the drill unit 4003 according to an operation of an operation switch (not illustrated).

Although the present disclosure has been described above based on the preferred Examples, the present disclosure is not limited to these Examples, and can be variously modified. The configurations, the structures, the raw materials used for the manufacturing, the manufacturing method, the manufacturing conditions, and the like of the charge and discharge control device and the secondary battery described in the Examples are exemplified, and the present disclosure is not limited thereto and can be appropriately changed. Furthermore, the secondary battery is not limited to the lithium ion secondary battery. In the Examples, the present disclosure is exclusively applied to the charge procedure (charge process), but the present disclosure can be applied to the discharge procedure (discharge process), and in this case, "state of charge (SOC)" may be read as "depth of discharge (DOD)".

Although Examples describe a technology of detecting the displacement occurring in the secondary battery due to the charging and discharging by one or a plurality of sensors and controlling the charging and discharging current based on the detection result of each of the sensors (that is, controlling the discharging current of the secondary battery so that the amount of displacement of the secondary battery is a predetermined threshold value), it is possible to control the amount of displacement of the secondary battery not to exceed the predetermined threshold value by controlling the charging and discharging voltage of the secondary battery and the temperature of the secondary battery.

That is, the method of charging and discharging a secondary battery that detects a displacement occurring in the secondary battery due to charging and discharging by one or a plurality of sensors and controls a charging and discharging voltage based on the detection result of each of the sensors may be the method of charging and discharging a secondary battery that controls a charging and discharging voltage of the secondary battery so that an amount of displacement of the secondary battery does not exceed a predetermined threshold value.

Figure 19:
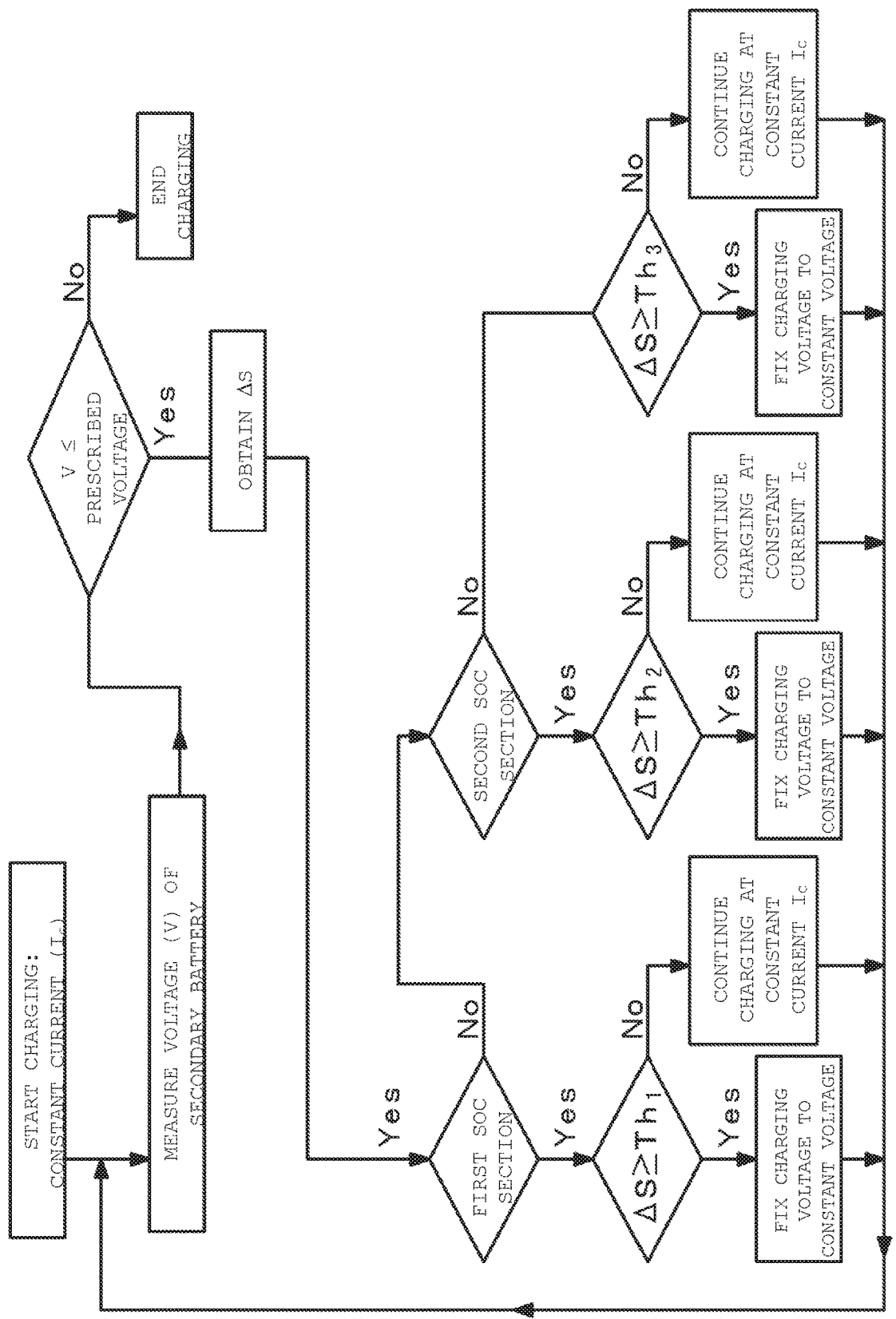
FIG. 19 is a flowchart illustrating a modified example of the method of charging and discharging a secondary battery according to an embodiment of the present disclosure.

Alternatively, there may be provided a charge and discharge control device including a secondary battery that includes one or a plurality of sensors detecting an amount of displacement occurring in the secondary battery due to charging and discharging and a controller that controls a charging and discharging voltage of the secondary battery based on the detection result of a sensor, in which the controller controls the charging and discharging voltage of the secondary battery so that the amount of displacement of the secondary battery does not exceed a predetermined threshold value (see flowchart of FIG. 19).

Alternatively, there may be provided a charge and discharge control device including a secondary battery pack including a plurality of secondary batteries that include one or a plurality of sensors detecting an amount of displacement occurring in the secondary battery due to charging and discharging and a controller that controls a charging and discharging voltage of the secondary battery pack based on the detection result of each of the sensors, in which the controller controls a charging and discharging voltage of each of the secondary batteries or the charging and discharging voltage of the secondary battery pack so that the amount of displacement of the secondary battery does not exceed a predetermined threshold value.

Alternatively, there may be provided a charge and discharge control device including a secondary battery pack that includes a plurality of secondary batteries and one or a plurality of sensors detecting an amount of displacement occurring in the secondary battery pack due to charging and discharging and a controller that controls a charging and discharging voltage of the secondary battery pack based on the detection result of each of the sensors, in which the controller controls the charging and discharging voltage of the secondary battery pack so that the amount of displacement of the secondary battery pack does not exceed a predetermined threshold value.

Figure 20:
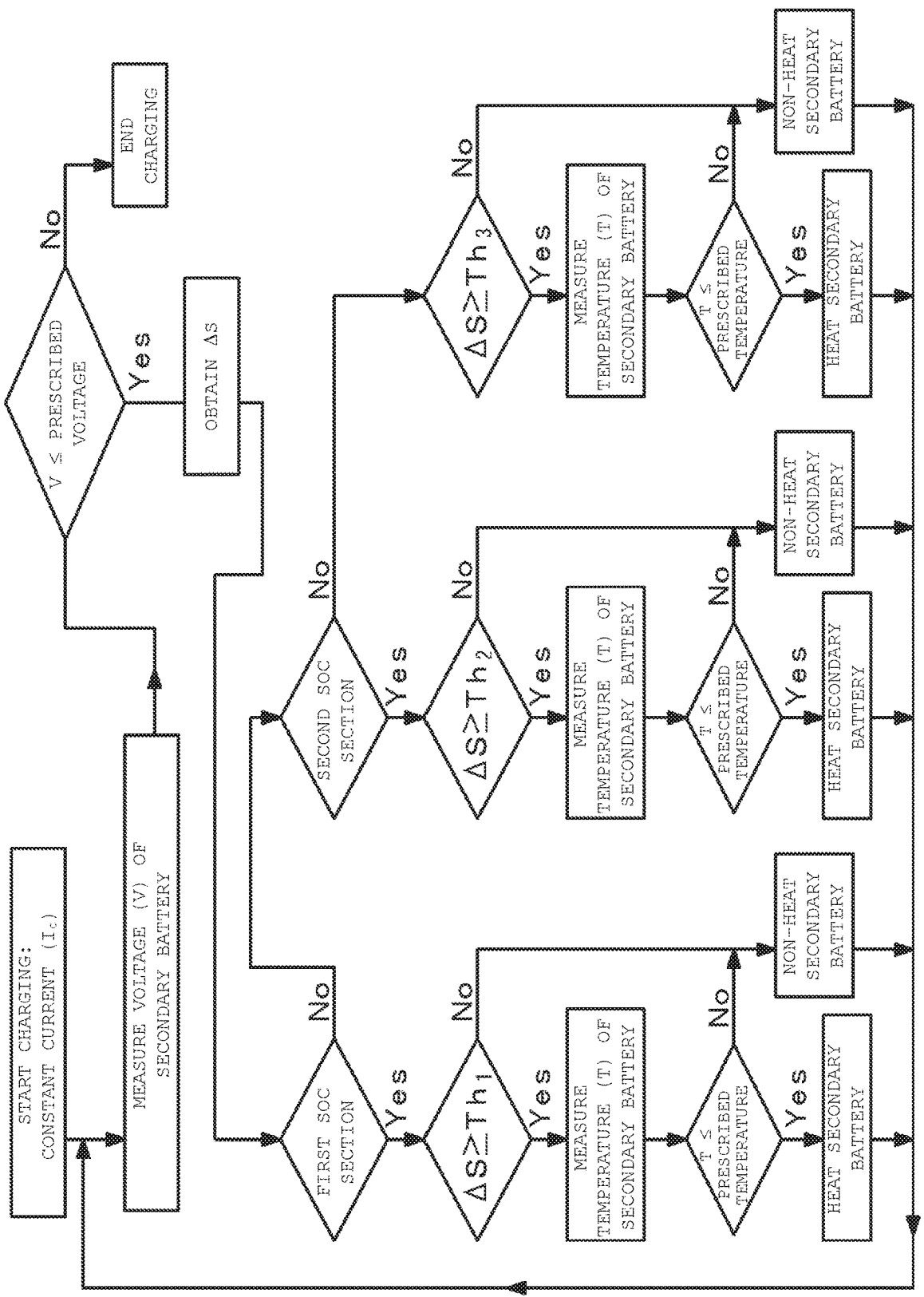
FIG. 20 is a flowchart illustrating another modified example of the method of charging and discharging a secondary battery according to an embodiment of the present disclosure.

Alternatively, the method of charging and discharging a secondary battery that detects a displacement occurring in the secondary battery due to charging and discharging by one or a plurality of sensors and controls a temperature of the secondary battery based on the detection result of each of the sensors may be the method of charging and discharging a secondary battery that controls a temperature of the secondary battery so that an amount of displacement of the secondary battery does not exceed a predetermined threshold value see a flow chart of FIG. 20).

Alternatively, there may be provided a charge and discharge control device including a secondary battery that includes one or a plurality of sensors detecting an amount of displacement occurring in the secondary battery due to charging and discharging and a controller that controls a temperature of the secondary battery based on the detection result of each of the sensors, in which the controller controls the temperature of the secondary battery so that the amount of displacement of the secondary battery does not exceed a predetermined threshold value.

Alternatively, there may be provided a charge and discharge control device including a secondary battery pack including a plurality of secondary batteries that include one or a plurality of sensors detecting an amount of displacement occurring in the secondary battery due to charging and discharging and a controller that controls a temperature of the secondary battery of the secondary battery pack based on the detection result of each of the sensors, in which the controller controls the temperature of each of the secondary batteries or the temperature of the secondary battery of the secondary battery pack so that the amount of displacement of the secondary battery does not exceed a predetermined threshold value.

Alternatively, there may be provided a charge and discharge control device including a secondary battery pack that includes one or a plurality of sensors detecting an amount of displacement occurring in the secondary battery pack due to charging and discharging and a controller that controls a temperature of the secondary battery pack based on the detection result of each of the sensors, in which the controller controls the temperature of the secondary battery pack so that the amount of displacement of the secondary battery pack does not exceed a predetermined threshold value.

In addition, there may be a correlation between the discharge capacity and the $S_{Ini}$ which change over time. In such a case, various tests can be performed in advance, and a table of the relationship between the discharge capacity retention rate and the $S_{Ini}$ can be prepared to correct for the change in the $S_{Ini}$ over time.

In the Examples, the secondary battery is configured to have the cathode member, the anode member, the separator, and the gel-like electrolyte, but alternatively, the secondary battery is configured to have the cathode member, the anode member, and the solid electrolyte layer. In the production of the solid electrolyte layer, a powder of a glass electrolyte having a composition of a mole fraction of $Li_2O:B_2O_3$: $SiO_2=54:11:35$ was prepared. 10 g of glass electrolyte powder, 16 g of butyl acetate dispersion to which 10% by mass of acrylic binder is added, 1.6 g of bis(2-ethylhexyl) phthalate as a plasticizer, 15 g of butyl acetate as an additional solvent were mixed to obtain electrolyte slurry. This electrolyte slurry was applied to have a predetermined thickness on a polyethylene-terephthalate (PET) substrate using a bar coater. Next, for the applied film, the solvent is removed for approximately 1 hour using a drying oven heated to 80° C. Thus, a green sheet of glass electrolyte could be obtained.

In the production of the first electrode layer, the following materials were weighed and stirred to prepare the slurry for the first electrode layer. The glass binder material includes the above-mentioned $Li_2O/B_4O_3/SiO_2$. In addition, in the production of the second electrode layer, the following materials were weighed and stirred to prepare the slurry for the second electrode layer.

Slurry for First Electrode Layer

Graphite: 3.00 g
Glass binder material: 3.00 g
Thickener composed of acrylic binder: 1.07 g
Solvent composed of terpineol: 6.25 g Slurry for Second Electrode Layer $LiCoO_2$: 3.00 g
Glass binder material: 3.00 g
Thickener composed of acrylic binder: 1.07 g
Solvent composed of terpineol: 6.25 g The slurry for the first electrode layer was applied to one surface of the green sheet of the glass electrolyte based on the screen printing method, and the slurry for the second electrode layer was applied to the other surface based on the screen printing method. Alternatively, the slurry for the first electrode layer can be applied on a PET substrate to a predetermined thickness using the bar coater and dried to obtain a green sheet for the first electrode layer, and the slurry for the second electrode layer can be applied on the PET substrate to a predetermined thickness using the bar coater and dried to obtain a green sheet for the second electrode layer. The green sheet for the first electrode layer, the glass electrolyte green sheet, and the green sheet for the second electrode may overlap. For example, after organic matters such as the binder and the plasticizer leave in a firing furnace heated to 320° C. for about 10 hours to be removed, the electrolyte was fired at a temperature of 400° C. to 420° C. for 10 minutes to be softened and sintered. Next, a connection portion formed of a platinum (Pt) layer was formed on the first electrode layer based on a sputtering method, and a connection portion formed of a platinum (Pt) layer was formed on the second electrode layer based on the sputtering method. Thus, the electrode structure (laminated structure) can be obtained.

The present technology is described below in further detail according to an embodiment.

Method of Charging Secondary Battery

[A01] A method of charging and discharging a secondary battery, including: detecting a displacement occurring in the secondary battery by one or a plurality of sensors due to charging and discharging; and controlling a charging and discharging current based on a detection result of each of the sensors, in which the charging and discharging current of the secondary battery is controlled so that an amount of displacement of the secondary battery does not exceed a predetermined threshold value.

[A02] The method of charging and discharging a secondary battery described in [A01], in which the charging and discharging current of the secondary battery is reduced so that the amount of displacement of the secondary battery does not exceed the predetermined threshold value.

[A03] The method of charging and discharging a secondary battery described in [A02], in which when the secondary battery is charged, in the secondary battery, a charging current of the secondary battery is reduced so that a value of $\Delta S = |S(SOC) - S_{Ini}(SOC)|/S_{max}$ does not exceed a predetermined threshold value.

Here, $S_{Ini}(SOC)$: Displacement amount obtained using a state of charge (SOC) value as a parameter when the secondary battery is charged to a current value that is k times a reference current value (however, 0<k<1), S(SOC): Displacement amount obtained using the SOC value as the parameter when secondary battery is actually charged, and $S_{max}$: Maximum value of the amount of displacement at a time of full charge in a previous time.

[A04] The method of charging and discharging a secondary battery according to any one of [A01] to [A03], in which the predetermined threshold value is defined depending on a range of the SOC value when the secondary battery is charged.

[A05] The method of charging and discharging a secondary battery according to any one of [A01] to [A04], in which the displacement occurring in the secondary battery is a distortion of the secondary battery or a change in thickness of the secondary battery.

Charge and Discharge Control Device: First Aspect

[B01] A charge and discharge control device, including: a secondary battery that includes one or a plurality of sensors detecting an amount of displacement occurring in the secondary battery due to charging and discharging; and a controller that controls a charging and discharging current of the secondary battery based on the detection result of each of the sensors, in which the controller controls the charging and discharging current of the secondary battery so that the amount of displacement of the secondary battery does not exceed a predetermined threshold value,

[B02] The charge and discharge control device according to [B01], in which the displacement occurring in the secondary battery is a distortion of the secondary battery or a change in thickness of the secondary battery.

[B03] The charge and discharge control device according to [B01] or [B02], in which the secondary battery includes a cathode member, an anode member, a separator, and a gel-like electrolyte.

[B04] The charge and discharge control device according to [B01] or [B02], in which the secondary battery includes a cathode member, an anode member, and a solid electrolyte layer.

Charge and Discharge Control Device: Second Aspect

[C01] A charge and discharge control device, including: a secondary battery pack that includes a plurality of secondary batteries including one or a plurality of sensors detecting an amount of displacement occurring in each of the secondary batteries due to charging and discharging; and a controller that controls a charging and discharging current of the secondary battery pack based on a detection result of each of the sensors, wherein the controller controls a charging and discharging current of each of the secondary batteries or the charging and discharging current of the secondary battery pack so that the amount of displacement of each of the secondary batteries does not exceed a predetermined threshold value.

Charge and Discharge Control Device: Third Aspect

[D01] A charge and discharge control device, including: a secondary battery pack that includes a plurality of secondary batteries and one or a plurality of sensors detecting an amount of displacement occurring in the secondary battery pack due to charging and discharging; and a controller that controls a charging and discharging current of the secondary battery pack based on a detection result of each of the sensors, wherein the controller controls the charging and discharging current of the secondary battery pack so that the amount of displacement of the secondary battery pack does not exceed a predetermined threshold value.

Method of Detecting Deterioration in Secondary Battery

[E01] A method of detecting deterioration in a secondary battery including one or a plurality of sensors, the method including: detecting, by each of the sensors, a displacement occurring in the secondary battery due to charging and discharging; and notifying that the secondary battery deteriorates when an amount of displacement of the secondary battery detected by each of the sensors exceeds a prescribed value.

Method of Detecting Charging Abnormality of Secondary Battery

[F01] A method of detecting charging abnormality of a secondary battery including one or a plurality of sensors, the method including: detecting, by each of the sensors, a displacement occurring in the secondary battery due to charging and discharging; and notifying that charging and discharging abnormality occurs in the secondary battery when an amount of displacement of the secondary battery detected by each of the sensors exceeds a prescribed value.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A charge and discharge control device, comprising:
   a secondary battery including one or more sensors configured to detect an amount of displacement in the secondary battery; and
   a controller configured to control a charging and discharging current of the secondary battery based on a detection result of each sensor,
   wherein in a case that the secondary battery is charged, a charging current of the secondary battery is reduced so that a value of $\Delta S = |S(SOC) - SIni(SOC)|/Smax$ does not exceed a threshold value,
   wherein SIni (SOC) is a displacement amount obtained using a state of charge (SOC) value as a parameter when the secondary battery is charged to a current value that is k times a reference current value (0<k<1), wherein S (SOC) is a displacement amount obtained using the SOC value as the parameter when the secondary battery is actually charged, wherein Smax is a maximum value of an amount of displacement at a time of full charge in a previous time, and wherein the threshold value is defined depending on a range of the SOC value when the secondary battery is charged.

2. The charge and discharge control device according to claim 1, wherein the displacement in the secondary battery is a distortion of the secondary battery or a change in thickness of the secondary battery.

3. The charge and discharge control device according to claim 1, wherein the secondary battery includes a cathode member, an anode member, a separator, and a gel-like electrolyte.

4. The charge and discharge control device according to claim 1, wherein the secondary battery includes a cathode member, an anode member, and a solid electrolyte layer.

5. A charge and discharge control device, comprising:
- a secondary battery pack including a plurality of secondary batteries including one or more sensors configured to detect an amount of displacement in each of the secondary batteries; and
- a controller configured to control a charging and discharging current of the secondary battery pack based on a detection result of each sensor, wherein in a case that the secondary batteries are charged, a charging current of the secondary batteries are reduced so that a value of $\Delta S=|S(SOC)-SIni(SOC)|/Smax$ does not exceed a threshold value, wherein SIni (SOC) is a displacement amount obtained using a state of charge (SOC) value as a parameter when the secondary batteries are charged to a current value that is k times a reference current value ($0<k<1$), wherein S (SOC) is a displacement amount obtained using the SOC value as the parameter when the secondary batteries are actually charged, wherein Smax is a maximum value of an amount of displacement at a time of full charge in a previous time, and wherein the threshold value is defined depending on a range of the SOC value when the secondary batteries are charged.

* * * * *